United States Patent [19]

Orihashi et al.

[11] Patent Number: 5,438,259
[45] Date of Patent: Aug. 1, 1995

[54] DIGITAL CIRCUITRY APPARATUS

[75] Inventors: Ritsuro Orihashi; Kosuke Kendo, both of Yokohama; Yoshihiko Hayashi, Yokosuka, all of Japan

[73] Assignee: Hitachi, Ltd., Tokyo, Japan

[21] Appl. No.: 324,924

[22] Filed: Oct. 18, 1994

Related U.S. Application Data

[62] Division of Ser. No. 70,113, Jun. 1, 1993.

[30] Foreign Application Priority Data

Jun. 5, 1992 [JP] Japan .................................. 4-145701

[51] Int. Cl.⁶ ............................................ G04F 10/00
[52] U.S. Cl. ..................................... 324/158.1; 371/1
[58] Field of Search .................... 371/1, 27; 324/158.1

[56] References Cited

U.S. PATENT DOCUMENTS 4,980,586 12/1990 Sullivan et al. .

FOREIGN PATENT DOCUMENTS 58-032178 2/1983 Japan .
61-081026 4/1986 Japan .
63-298076 12/1988 Japan .
03-131778 6/1991 Japan .
03-135779 6/1991 Japan .

OTHER PUBLICATIONS

Johnson et al., "A Variable Delay Line PLL for CPU-Coprocessor Synchronization", IEEE Journal of Solid-State Circuits, V. 23, No. 5, pp. 1218–1223, 1992.
Chapman, J., "High-Performance CMOS-Based VLSI Testers: Timing Control and Compensation", International Test Conference Proc., IEEE 1993, pp. 59–67.
Branson et al., "Integrated Pin Electronics for a VLSI Test System", International Test Conference Proc., IEEE 1988, pp. 23–27.

Primary Examiner—Kenneth A. Wieder
Assistant Examiner—Mark A. Wardas
Attorney, Agent, or Firm—Fay, Sharpe, Beall, Fagan, Minnich & McKee

[57] ABSTRACT

In a digital circuitry apparatus in which clock distribution can be performed with high accuracy even in the case where variations in delay time are caused by variations in the apparatus operating condition, programmed input data set to delay circuits are corrected by a circuit portion for measuring the delay time of a phase shifting adjustment delay circuit with respect to variations in delay time caused by variations in the apparatus operating condition, a first arithmetic operation circuit for calculating the rate of variation on the basis of measured values, and a second arithmetic operation circuit for calculating the quantity of variation on the basis of the rate of variation.

3 Claims, 21 Drawing Sheets

FIG. 5

| NO.K | SET VALUE R(K) OF CYCLE CLOCK | SET VALUE E(K) OF EDGE CLOCK | OUTPUT VALUE C(K) OF ADDER A | OUTPUT VALUE D(K) OF ADDER C |
|---|---|---|---|---|
| n-5 | 1.75t | 0.5t | 1.75t | 0.5t |
| n-4 | 1.75t | 0.75t | 3.5t | 2.5t |
| n-3 | 2.75t | 1.75t | 6.25t | 5.25t |
| n-2 | 2.5t | 3.0t | 8.75t | 9.25t |
| n-1 | 1.75t | 1.5t | 10.5t | 10.25t |
| n | 1.75t | 2.0t | 12.25t | 12.5t |
| n+1 | 1.5t | 3.5t | 13.75t | 15.75t |
| n+2 | 1.5t | 4.5t | 15.25t | 18.25t |
| n+3 | 1.25t | | 16.5t | |
| n+4 | 2.25t | | 18.75t | |

FIG. 7

| CONNECTION | RESISTANCE VALUES |
|---|---|
| A^B^C^D | 12R/25 |
| A^B^C | 6R/11 |
| A^B^D | 4R/7 |
| A^C^D | 12R/19 |
| A^B | 2R/3 |
| A^C | 3R/4 |
| A^D | 4R/5 |
| B^C^D | 12R/13 |
| A | R |
| B^C | 6R/5 |
| B^D | 4R/3 |
| C^D | 12R/7 |
| B | 2R |
| C | 3R |
| A | 4R |

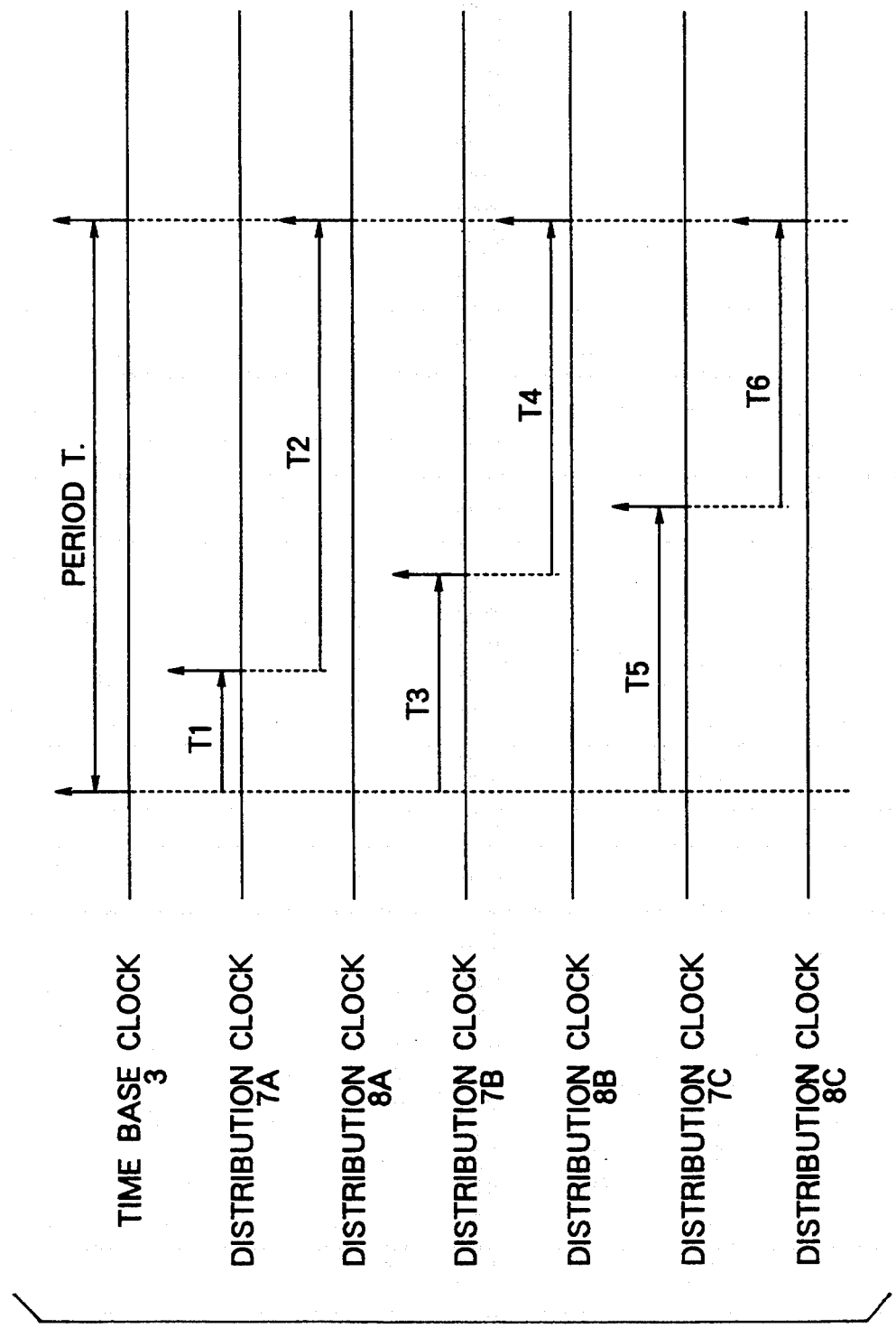

DIGITAL CIRCUITRY APPARATUS

This is a divisional application of U.S. Ser. No. 08/070,113, filed Jun. 1, 1993.

FIELD OF THE INVENTION AND RELATED ART STATEMENT

The present invention relates to a digital circuitry apparatus in which a clock signal is distributed into clock signals to be supplied, and particularly relates to a digital circuitry apparatus adapted to keeping the phase relations between the supplied clock signals highly accurate.

The prior art related to the digital circuitry apparatus will be described below while the apparatus is classified into two types, namely, the digital circuitry apparatus of the type having a variable-period clock generating function for distributing a clock signal into variable-period clock signals supplied to other circuit portions as represented by an automatic test equipment, and the digital circuitry apparatus of the type receiving distribution/supply of a constant-period clock signal as represented by a micro-processor.

The function of an IC as a device under test (DUT) is generally tested as follows. Various kinds of test stimuli from an automatic test equipment are applied to the DUT in each test cycle, so that various kinds of response signals from the DUT are fetched in the automatic test equipment. In certain judgment timing in accordance with each of the response signals, a judgment is made as to whether the DUT is good or not. As a result, the DUT is tested as to whether the function of the DUT is normal or not. In recent years, the phase difference between stimuli and the phase difference between timings of judgment of response signals have needed to be kept in desired relations highly accurately in the case of testing of ICs with advance of high-speed operation of the ICs.

FIG. 16 is a block diagram showing an example of a conventional automatic test equipment adapted to the above-mentioned test. In this example, a time base clock signal J18 from a system clock oscillator (hereinafter referred to as "time base") J01 is supplied to a timing generator J02 so that the timing generator J02 generates a cycle clock signal for determining the test cycle and edge clock signals (hereinafter referred to as "judgment strobe") for determining the timing of the applied test stimuli and the judgment timing of the response signals. The edge clock signals are supplied to a pin controller J05 through a delay circuit B (J04) for adjusting phase shifting between the edge clock signals which will be described later. In a wave formatter J05a and a comparison/judgment circuit J05b in the pin controller, generation of applied test stimuli and judgment of response signals are performed in each test cycle. A fail memory J05c serves to store a result of the judgment. A driver J06a in a pin electronics portion J06 serves to make the test stimulus generated in the wave formatter J05a coincide with the signal level of the DUT J08. A comparator J06b serves to make the response signal coincide with the signal level of the comparison/judgment circuit J05b by using a reference voltage supplied from a reference electric source J06c. A DUT electric source J06 is a variable electric source for supplying a voltage to the DUT J08. A DC measurement circuit J10 is provided for DC test which is performed separately from the function test. A phase shifting adjustment circuit J11 is provided for adjusting edge clock signals so that application of test stimuli and judgment of response signals from the DUT J08 can be performed with predetermined phase relations. The execution control of such a series of test, the analysis of a result of the test, and the like, are performed timely by a test controller J13 through a bus J12.

Referring to FIGS. 17 through 19, the structure of the timing generator J02 and the phase adjusting method used therein will be described in detail. FIG. 17 is a block diagram showing an example of the timing generator J02 which is used in combination with a phase adjustment delay circuit B (J04). FIG. 18 is a time chart of generation of edge clock signals. FIG. 19 is an operation time chart of phase adjustment. A counter A (K03) in a cycle clock generator K01 counts time base clock pulses J18 and then delays a count output clock signal K09 in a delay circuit A (K04) to thereby generate a cycle clock signal K10 having desired periods R(K) and R(K+1) in accordance with the test cycle (in which K is the number of cycles). The desired periods are called "set periods". The set periods are preliminarily stored in a memory or the like in a data setting circuit K05 so that the set periods can be read out as occasion demands. Memory addresses A(K) and A(K+1) (not shown in FIG. 18) necessary for reading are supplied from a pattern generator J03. On the other hand, a counter circuit B (K06) in an edge clock generator K02 counts the time base clock signal J18 in the same manner as described above to thereby generate a count clock signal K12 having a delay quantity which is an integer multiple of the time base period. The count clock signal K12 is delayed in a delay circuit A (K07) to thereby generate an edge clock signal K13 having desired delay quantities E1(K) and E1(K+1). Although a plurality of edge clock generators as described above are provided, different delay quantities may be set to the edge clock generators respectively as represented by E2(K) and E2(K+1) in FIG. 18. This example shows the case where the delay quantity of the edge clock signal exceeds the set period of the cycle clock signal, that is, E2(K) > R(K).

Respective edge clock signals are supplied to the wave formatter J05a, the driver J06a and the comparison/judgment circuit J05b through different paths and circuit constituent elements. Accordingly, the phase relations between the generated test stimuli and the phase relations between timings of comparison/judgment of the response signals cannot be kept desirable, so that phase shifting occurs. Therefore, the delay circuit B (J04) is adjusted by the phase shifting adjustment circuit J11 before execution of the test so that the phase difference is eliminated to zero. FIG. 19 shows the condition of such adjustment. When equal delay quantities Ta, Tb and Tc are set to the edge clock generators 1 to 3 in FIG. 17, edge clock pulses 1 to 3 are actually generated in points A' to C' because of phase shifting produced in the edge clock generators. The adjustment of phase shifting is performed by changing the positions of the edge clock pulses by ta, tb and tc respectively through the delay circuit B (J04) to thereby move the positions to points A to C respectively with respect to time (for convenience sake of description, FIG. 19 shows the case where the points A, B and C are points in which phase difference between the test stimuli and phase difference between judgment timings are zero).

Known apparatuses related to this type apparatus have been described in JP-A Nos. 58-32178, 61-81026, 63-298076, 3-131778 and 3-135779.

On the other hand, in the case of digital circuitry such as a micro-processor, a constant-period clock signal from the time base 3 is distributed to respective circuits through delay circuits 1A, 1B and 1C as shown in FIG. 20. Circuit elements for distribution (hereinafter referred to as "distribution elements") 2A, 2B and 2C are provided for distributing clock signals to respective circuits in circuit groups 5A, 5B and 5C to be driven. In the circuitry apparatus having such structure, difference is produced between delay time values required for movement of the clock signal from the time base 3 to respective circuit blocks because of difference between wiring lengths of from a distributor 6 constituted by logical gates to circuit groups 5A, 5B and 5C to be driven and difference in delay time between circuit constituent elements. Further, in the case where a larger number of circuit groups are to be driven, not only difference in the delay time per se of the distributor between the time base 3 and the circuit groups to be driven becomes large but difference (phase shifting) between delay time values required for movement of the clock signal to the respective circuits becomes large. Accordingly, the delay time per se required for distribution becomes large, so that phase shifting with respect to the clock signal from the time base 3 as a phase reference becomes large. The delay circuits 1A, 1B and 1C are provided for adjustment of the phase shifting so that clock signals with the same phase can be inputted to the circuit groups 5A, 5B and 5C. AS in the case of the above-mentioned automatic test equipment, a phase shifting adjustment circuit and the like are required for adjustment. The phase shifting adjustment circuit and the like are not shown in FIG. 20. FIG. 21 shows the condition of such adjustment. Adjustment is preliminary performed so that the phases of clock signals obtained by distribution of the clock signal from the time base 3 are equal to the phase of the clock signal supplied from the time base 3 at the inputs 8A, 8B and 8C of the circuit groups 5A, 5B and 5C. That is, in the case where the distribution clock signals 7A, 7B and 7C supplied from the time base 3 reach the delay circuits 1A, 1B and 1C after different delay time values T1, T3 and T5 respectively, data setting is performed through data setting registers 4A, 4B and 4C by the separately provided phase shifting adjustment circuit so that the clock pulses are delayed by delay time values T2, T4 and T6 in the delay circuits 1A, 1B and 1C. As a result, data are inputted as the same phase relation of the time base clock signal. Apparatuses related to this type apparatus have been described in IEEE JOURNAL OF SOLID-STATE CIRCUITS Vol. 23, No. 5, pp. 1218–1223.

In the conventional automatic test equipment, various kinds of tests are executed on the DUT (J08) in the condition in which non-coincidence (phase shifting) between propagation delays of respective signals due to the characteristic of the signal transmission element and the length of the signal transmission path is eliminated. There is no special problem if a wide variation does not occur in the operating condition of the automatic test equipment and the peripheral environment. However, if the operating condition such as peripheral temperature, supply voltage, etc. varies widely in a period of execution of the test or before and after the test to thereby change the delay characteristic of the delay circuits in the edge clock generators, the delay time values set in the delay circuits changes in a constant rate. Because different delay time values are generally set to the delay circuits respectively, the changes of the delay time values from the input data set in the delay circuits are different between the delay circuits. Accordingly, the phase relations between the test stimuli and the phase relations between the judgment strobes cannot be kept in normal phase relations accurately, so that phase shifting occurs. As a result, the test cannot be performed sufficiently. In the conventional automatic test equipment, there is no consideration of this respect.

Also in the digital circuitry apparatus such as a micro-processor, correction of phase shifting between distribution clock signals is performed in the same manner as in the case of the automatic test equipment. However, the phase relations between the distribution clock signals and the time base clock signal cannot be kept in desired relations because of the changes of delay time or delay characteristic of the delay circuits. As a result, of the operation of the apparatus as a whole cannot be made normally. In the conventional digital circuitry apparatus, there is no consideration of this respect.

SUMMARY OF THE INVENTION

An object of the present invention is to provide an automatic test equipment which is, for example, formed by using an MOSLSI so that testing is performed with high accuracy without stopping of the testing operation original to the equipment, without stopping of clock distribution and without of stopping of processing even in the case where a large variation occurs in the operating condition of the apparatus per se and the peripheral environment condition, and also provide a digital circuitry apparatus in which clock distribution can be performed.

To achieve the foregoing object, in the digital circuitry apparatus according to the present invention, there are provided a circuit for calculating the rate of variation in real delay time in a certain delay circuit or in an oscillator constituted by a delay circuit, and a circuit for correcting delay time data set in the delay circuit to be subjected to correction of delay time variation on the basis of the variation rate.

Phase shifting caused by variations in the apparatus operating condition and the like can be compensated by the steps of: measuring the real delay time of a delay circuit or the real delay time of a delay circuit for measurement of variations in the propagation delay; calculating the rate of variation with respect to the real delay time at a certain point of time; and correcting phase shifting in accordance with the delay data set in the respective delay circuits on the basis of the calculated variation rate.

BRIEF DESCRIPTION OF THE DRAWINGS

FIG. 5 is a view for explaining respective set values in the timing generator depicted in FIG. 4;

FIG. 7 is a view for explaining respective resistance values in the delay circuit depicted in FIG. 6;

FIG. 21 is a time chart showing the operation of the clock distributor depicted in FIG. 20.

DETAILED DESCRIPTION OF THE PREFERRED EMBODIMENTS

Figure 1:
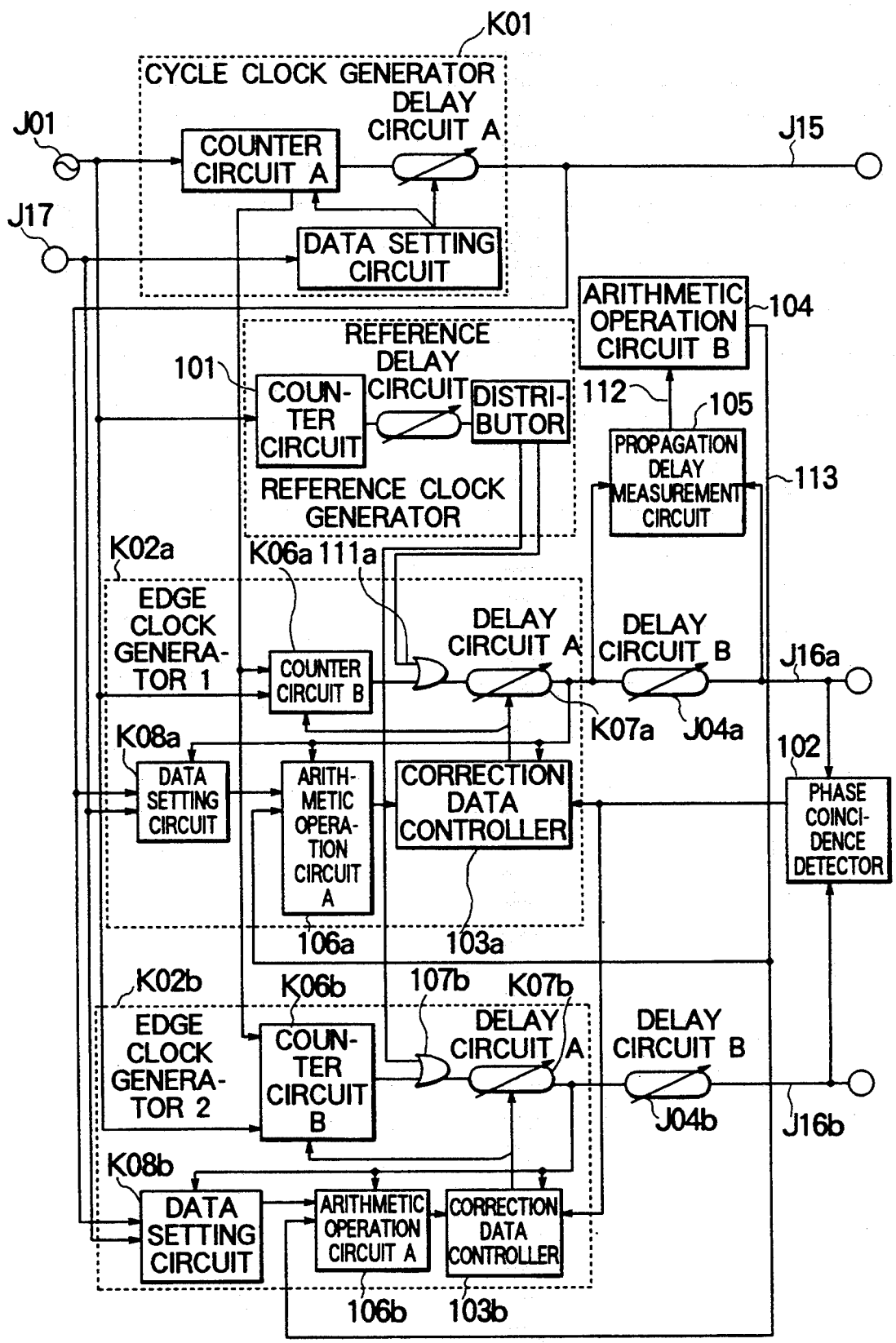
FIG. 1 shows an embodiment of a timing generator in an automatic test equipment according to the present invention.

Referring to FIG. 1, there is shown the configuration of a timing generator which is an important part of an automatic test equipment using a digital circuitry apparatus according to the present invention. In FIG. 1, a reference clock generator 101, a phase coincidence detector 102 and correction data controllers 103a and 103b are provided for correction of resolution of delay circuits, and a propagation delay measurement circuit 105, an arithmetic operation circuit B 104 and arithmetic operation circuits A 106a and 106b are provided for adjustment of phase shifting due to variations in operating and environmental conditions of the equipment. The correction of resolution will be described before the adjustment of phase shifting will be described.

In FIG. 1, a cycle clock generator K01 generates a cycle clock signal at an output terminal J15 in accordance with a desired set period. As known well, counter circuits B (K06a and K06b) in edge clock generators K02a and K02b perform digital counting of time base clock pulses supplied from a time base J01 so that count clock signals having integer multiples of the time base period are outputted to delay circuits A (K07a and K07b) in the following stages in accordance with the programmed delay quantities, respectively. Fine delays which cannot be measured by the counter circuits B (K06a and K06b) are measured by counter circuits A (K07a and K07b) as follows. Count clock pulses inputted to the delay circuits A are delayed by quantities smaller than the time base period in accordance with the programmed delay quantities. Thus, edge clock signals having desired programmed delay quantities are generated and outputted at output terminals J16a and J16b, respectively.

In order to compensate accuracy in resolution of the delay circuits A (K07a and K07b), in this embodiment, the reference clock generator 101 for receiving a time base clock signal from the time base J01 and for generating a reference clock signal having highly accurate resolution as a reference includes a counter circuit, a reference delay circuit, and a distributor for selectively distributing the reference clock signal to the respective delay circuits. The distributor is connected to the delay circuits A having the reference clock signal and the count clock signal as input signals through selection gates 107a and 107b for selectively inputting the reference clock signal and the count clock signal to the delay circuits, respectively. In this embodiment, there are further provided the phase coincidence detector 102 for detecting phase coincidence between the reference clock signal and the count clock signal, and the correction data controllers 103a and 103b for setting data in the delay circuits in order to detect phase coincidence and for storing data at the time of detection of phase coincidence.

Figure 2:
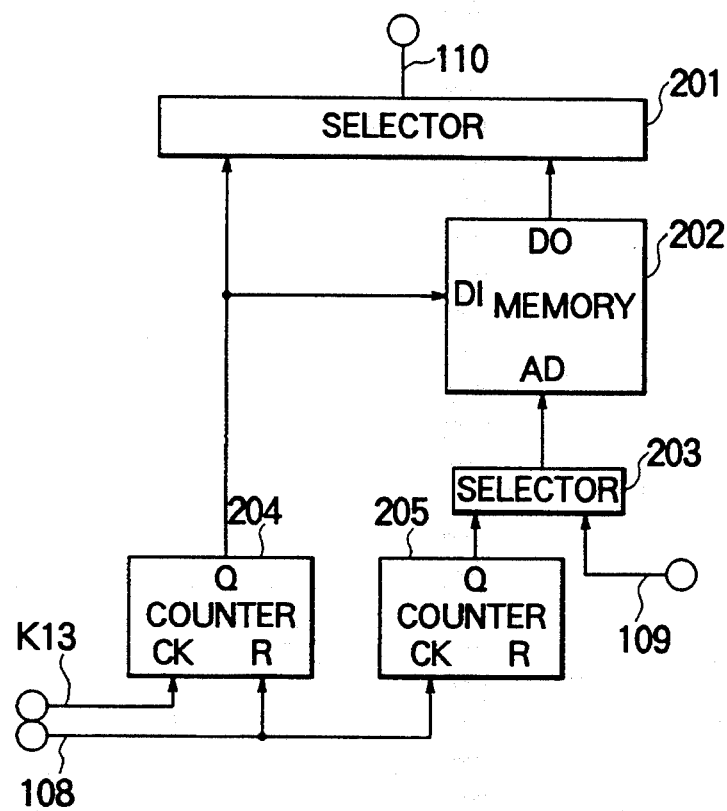
FIG. 2 shows an embodiment of the correction data control circuit depicted in FIG. 1.

Referring to FIG. 2, there is shown an example of the configuration of each of the correction data controllers 103 (103a and 103b). The correction data controller 103 includes a counter 204 for an edge clock signal K13, a memory 202 for storing data programmed to secure highly accurate resolution of the delay circuit A (K07), an address counter 205 for outputting an address of the memory, a selector 201 for selecting one from the output of the counter 204 and the output of the memory 202 to supply the selected output to the delay circuit A (K07), and a selector 203 for selecting one from the output of the address counter and the data set by the arithmetic operation circuit A 106 (the data setting circuit K108) to supply the selected output as an address of the memory 202. Though not shown, control registers, etc. control the selectors 201 and 203 so that one output is selected from the outputs of the counters 204 and 205 at the time of determination of correction set data of the delay circuit but one output is selected from the outputs of the memory 202 and the arithmetic operation circuit A 106 (data setting circuit K108) at the time of real automatic test.

For convenience sake, the following description will be made upon the case where resolution of edge clock signals outputted at the output terminals J16a and J16b is corrected. The counter circuit in the reference clock generator 101 is set so that the cycle thereof is equal to the cycle of the count clock signal outputted by the counter circuit B in the edge clock generator K02a (or the like). Before correction, the reference delay circuit is pre-corrected so that a clock signal with required resolution can be generated with high accuracy.

The reference clock signal thus generated is inputted to the distributor. The output of the counter circuit B (K06b) and the output 111a of the distributor are controlled to be in low levels so that the count clock signal from the counter circuit B (K06a) and the reference clock signal from the distributor are supplied to the delay circuit A (K07a) and the counter circuit B (K06a)

respectively. Then, a series of data, for example, bit search data (count values of the edge clock signal K13 in FIG. 2), are successively supplied from the correction data controller 103a to the delay circuit A (K07a) so that the count clock delay quantity of the delay circuit A (K07a) is changed unless the phase coincidence between the count clock signal and the reference clock signal is detected by the phase coincidence detector 102. When the phase coincidence between the count clock signal and the reference clock signal is detected, data to the delay circuit A (K07a) is detected and stored in the correction data controller 103a. That is, in the correction data controller in FIG. 2, the count output of the counter 204 at a point of time is stored in the memory 202 in accordance with the phase coincidence signal 108. At the same time, the counter 204 is reset in order to generate the next bit search data. The reason why the counter 204 is reset before restarting of counting is as follows. This is because it is thought of that the size of control data given to the delay circuit is not proportional to the delay quantity obtained on the basis of the size of control data and that the delay quantity may decrease partly as the control data increases, in the case where a low accurate delay circuit which will be described layer is used.

Then, the programmed delay quantity of the reference delay circuit in the reference clock generator 101 is set so as to be increased by the quantity of resolution to be corrected. Then, the delay quantity of the edge clock signal K13 outputted from the delay circuit A (K07a) is changed by the correction data controller 103 in the same manner as described above. When the phase coincidence between the edge clock signal and the reference clock signal is detected, data given to the delay circuit A (K07a) is stored in the correction data controller 103a. Thereafter, the operation of increasing the programmed delay quantity of the reference delay circuit in accordance with desired resolution and storing the programmed input data of the delay circuit A (K07a) at the time of detection of the coincidence is repeated in the same manner as described above, so that the resolution of the edge clock signal outputted at the output terminal J16a is corrected. In this manner, the programmed input data given to the delay circuit A at the time of detection of the phase coincidence is stored so that a clock signal with accurate resolution can be outputted by using the programmed input data when occasion demands.

On the other hand, correction of resolution of the delay circuit A (K07b) is performed in the same manner as described above in the condition that the count clock signal and the reference clock signal are inputted to the delay circuit A (K07b) and the delay circuit A (K07a) respectively.

Figure 3:
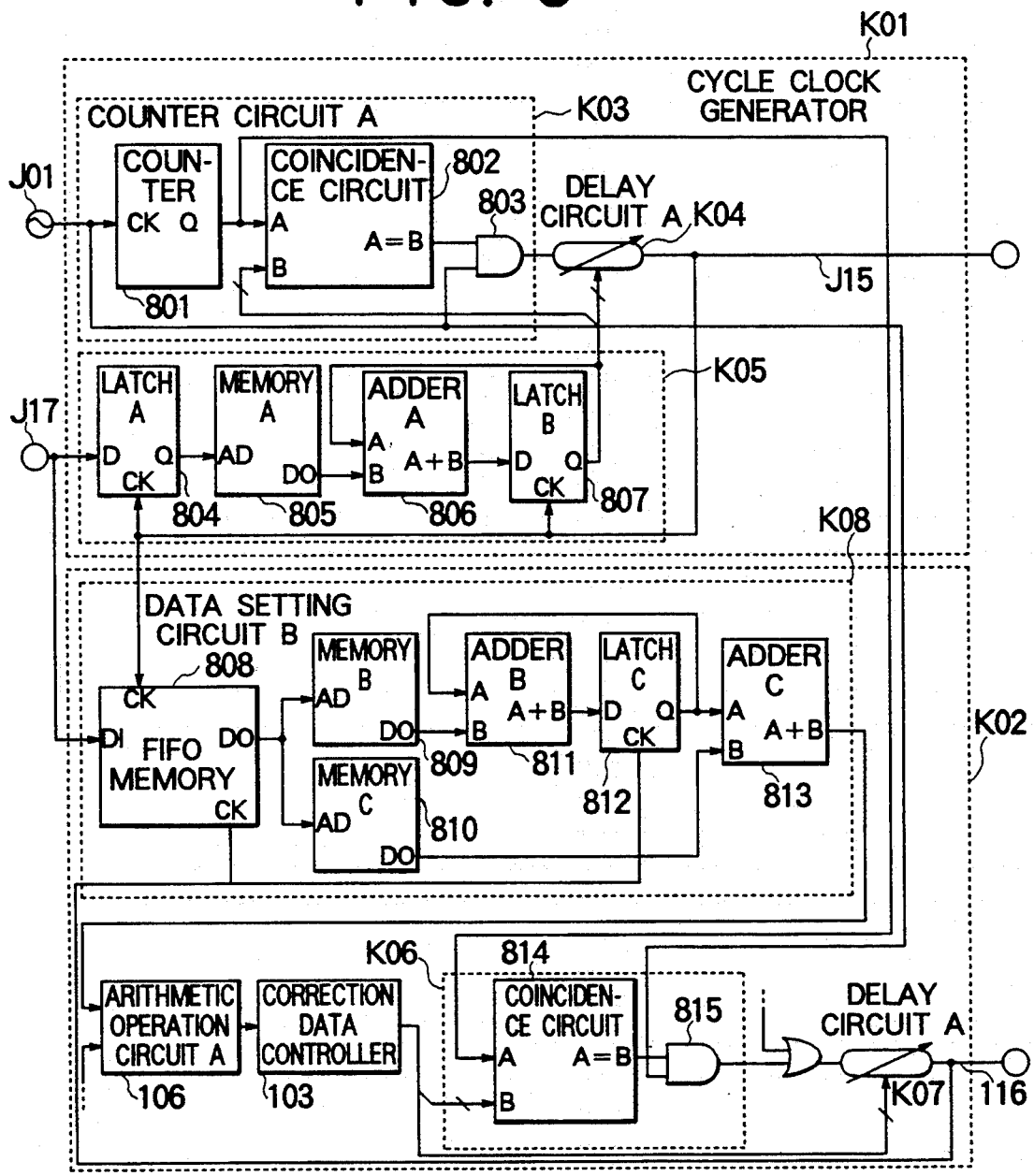
FIG. 3 shows an example of the configuration of the timing generator.
Figure 4:
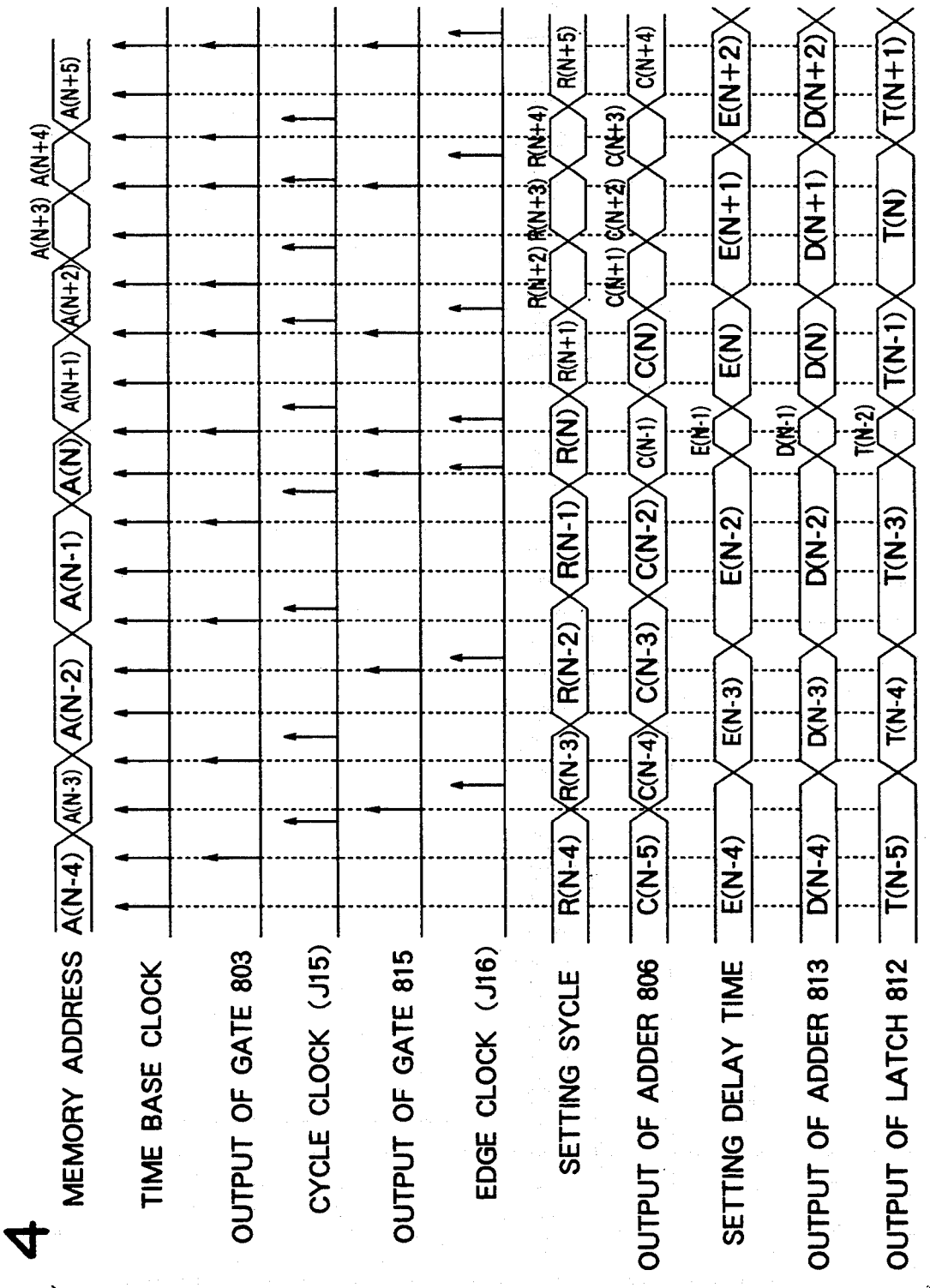
FIG. 4 is a time chart showing the operation of the timing generator.

Referring to FIGS. 3 through 5, an example of the configuration of the edge clock generator will be described below. Clock signals to be generated are the cycle clock signal J15 and the edge clock signal J16 shown in FIG. 4. Before these clock signals are generated, the desired set cycle R(K) of the cycle clock signal J15 and the set delay time E(K) of the edge clock signal J16 based on the cycle clock signal J15 are determined and stored in respective memories A 805 and B 809 (K=, 2, 3, ..., N, ...). The same data (set cycle) as stored in the memory A 805 is stored in a memory C 810. In this example, these set values R(K) and E(K) are expressed by arbitrary multiples of the time base period t as shown in FIG. 5. The delay circuit. A (K07) may be corrected by using this embodiment in combination with the previous embodiment for performing correction of resolution and correction of phase shifting due to variations in the apparatus operating condition. For convenience sake, however, the following description will be made upon the case where the delay circuit A (K07) is high accurate so that these corrections are not required.

As shown in FIG. 3, in this example, a counter 801 is provided for counting time base clock pulses generated by the time base J01. The output of the counter is inputted to coincidence circuits 802 and 814. On the other hand, the address (A(K) in FIG. 4) in which the set cycle is stored is supplied to the memory A 805 through a latch A 804. The set cycle R(K) is read out to an arithmetic operation circuit constituted by an adder A 806 and a latch B 807 in accordance with the address. The arithmetic operation circuit serves to successively add set cycles read from the memory A 805 and accumulate the set cycles. The output (latch B 807) of the arithmetic operation circuit controls the delay quantity of the delay circuit A (K04). When the coincidence circuit A 802 detects the coincidence between the output value (C(K) in FIG. 4) of the arithmetic operation circuit and the output value of the counter, the gate 803 is opened so that the time base clock signal can pass through the gate 803 to thereby generate a clock signal having an integer multiple of the time base cycle. The clock signal thus generated is inputted to the delay circuit A (K04). A delay quantity smaller than the time base cycle is set in the delay circuit A (K04), so that a cycle clock signal J15 having a desired set cycle is generated. When, for example, a cycle clock signal having a cycle corresponding to the set cycle R(N)=1.75 t is to be generated, the output value C(N) of the arithmetic operation circuit is 12.25 t=12 t+0.25 t. Accordingly, when the output value of the counter 801 becomes 12, coincidence is detected by the coincidence circuit 802 so that a clock pulse is outputted from the gate 803. At this time, the delay quantity of 0.25 t is set in the delay circuit A (K04), so that the clock pulse is delayed in accordance with the set value. Thus, the cycle clock signal J15 having the cycle of 1.75 t is outputted.

With respect to generation of the edge clock signal J16, addresses of the memories C 810 and B 809 in which the set cycle R(K) and the set delay time E(K) are stored respectively are written in a first-in first-out (FIFO) memory 808 in synchronism with the cycle clock signal J15 and outputted in timing given by the edge clock signal J16. As a result, the set cycle R(K) and the set delay time E(K) are read from the memories C 810 and B 809, respectively. In an arithmetic operation circuit constituted by an adder B 811 and a latch C 812, addition and accumulation of set cycles up to the (K−1)-th set cycle are performed in the same manner as described above. The accumulated value is added to the set delay time E(K) by an adder C 813. The output value D(K) Of the adder C 813 is delivered to a coincidence circuit 814 through an arithmetic operation circuit 106 and a correction data controller 103, so that coincidence between the output value D(K) and the output value of the counter 801 is detected by the coincidence circuit 814. As described above, it is assumed for convenience sake that the output value D(K) of the adder C (K08) is outputted without any change via the arithmetic operation circuit A 106 and the correction data controller 103. When coincidence is detected, the gate 815 is opened so that the clock pulse signal from the time base J01 can pass through the gate to thereby generate a clock signal having a cycle being an integer multiple of the time base cycle. Delaying is performed by the delay circuit A (K07) so as to be smaller than the time base cycle, so that a desired edge clock signal J16 is obtained. The delay quantity of the delay circuit A (K07) is controlled on the basis of the output value D(K) of the adder C 813. When, for example, an edge clock signal having the set delay time E(N)=2 t with respect to the set cycle R(N)=1.75 t is to be generated as shown in FIGS. 4 and 5, the output value D(N) of the adder C 813 is 12.5 t=12 t+0.5 t. Accordingly, when the output value of the counter 801 becomes 12, coincidence is detected by the coincidence circuit 814 so that a clock pulse is outputted from the gate 815. At this time, the delay quantity of 0.5 t is set in the delay circuit (K07), so that the clock pulse is delayed in accordance with the set value. Thus, the edge clock signal J16 having the set delay time 2t is outputted. In this embodiment, the first-in first-out memory 808 for outputting data (addresses of the memories B and C) in synchronism with the edge clock signal is provided so that the set delay time E(N) of the N-th edge clock pulse can be set to be larger than the N-th set cycle R(N) of the cycle clock signal J15. That is, the N-th edge clock pulse can be set to be later than the (N+1)-th cycle clock pulse. In this embodiment, the N-th edge clock pulse can be set to be later than the (N+M−1)-th cycle clock pulse in the case where the first-in first-out memory has the depth of M stages.

Figure 6:
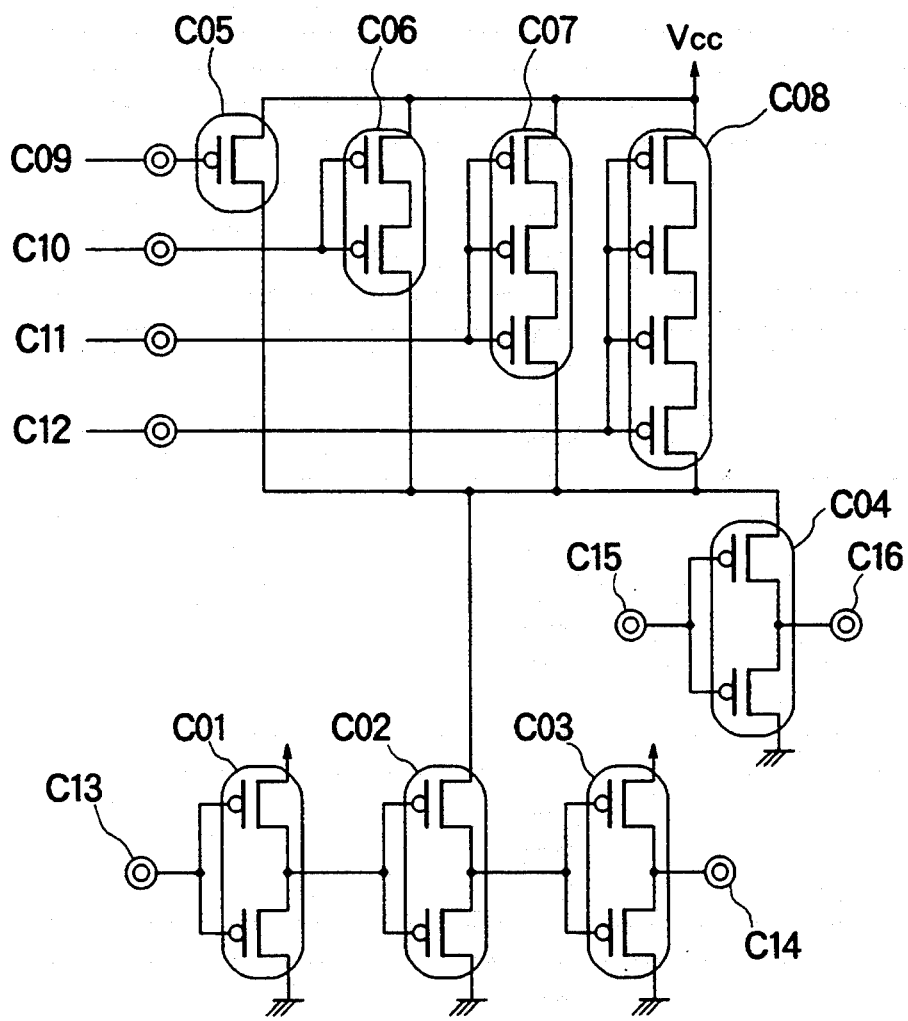
FIG. 6 shows an example of the configuration of a delay circuit.

For example, the above-mentioned delay circuit can be provided in the circuitry configuration shown in FIG. 6. In FIG. 6, a pulse to be delayed by the delay circuit of this example is inputted, through an input inverter C01 as a buffer circuit, to the next-stage inverter C02. Between a P-channel transistor (hereinafter referred to as "P-CH transistor") C02a of the inverter C02 and an electric source VCC, there are provided a delay controller in which P-CH transistor trains C05, C06, C07 and C08 having 1, 2, 3 and 4 series-connected P-CH transistors respectively are connected in parallel, and control inputs C09 to C12. Accordingly, by giving a low-level logical signal to any one of the control inputs C09 to C12, a corresponding transistor train can be turned on so that the inverter C02 and the electric source VCC can be electrically connected through the turning-on resistance of the P-CH transistors. As a result, the value of the turning-on resistance in the delay controller can be changed in accordance with the manner of giving the low-level logical signal. On the other hand, the delay time of a pulse to be inputted to the inverter C02 is approximately proportional to the time constant of a circuit constituted by the P-CH transistor of the inverter C02, the delay controller and the input of the output inverter C03. Accordingly, when the manner of giving the low-level logical signal to be inputted to the control inputs C09 to C12 is changed, a pulse having a different delay quantity in accordance with the different value of the turning-on resistance can be outputted from the inverter C02. When, for example, a low-level logical signal is given to the control input C12 while high-level logical signals are given to the control inputs C09 to C11 respectively, only the transistor train C08 is turned on so that the inverter C02 and the electric source VCC can be electrically connected through resistance of 4R in which R represents the turning-on resistance of one P-CH transistor. That is, because the resistance of 4 R is series-connected to the P-CH transistor of the inverter C02, the total turning-on resistance is 5 R. On the contrary, when a low-level logical signal is given to the control input C11 alone, the total turning-on resistance is 3 R+R=4 R. Accordingly, the difference in delay time between input pulses obtained in the two cases is approximately determined on the basis of the change of the turning-on resistance, so that the delay time difference corresponding to 5 R−4 R=R is obtained. FIG. 7 shows all combinations of turning-on resistances obtained in this embodiment. In FIG. 7, A represents a transistor train C05, B represents a transistor train C06, C represents a transistor train C07, D represents a transistor train C08, and A^B^C^represents the condition that the transistor trains C05, C06 and C07 are turned on so as to be connected in parallel. The thus delayed input pulse is inputted to the inverter C03 as an output circuit, restored to a pulse having a normal logical voltage level and outputted. The gist of this delay circuit is in that a larger delay time width or a smaller delay time difference is obtained by connecting delay circuits in cascade connection or by changing the number of transistors arranged in series or parallel within a delay controller.

In FIG. 6, a second output inverter C04 is provided for testing the current conduction of series-connected transistors in the delay controller. When, for example, a low-level logical signal is given to the control input C11 alone and then a low-level signal is given to the input C15, the level of the output C16 becomes high so that the current conduction of the transistor train C07 is detected. Even in the case where a high-level logical signal is then given to the input C15 and then high-level logical signals are given to all the control inputs C09 to C12 while a low-level logical signal is given to the input C13, the current conduction of the transistor train C08 can be tested by detecting the turning of the output C16 to a high level through successively supplying low-level signals to the control input C12 and the input C15 after Checking the output C16 kept in a low level. In the description, the second output inverter C04 is provided for performing the current conduction test on delay controllers individually and parallelly in the case where delay circuits as described above are connected in cascade connection. The same test as described above can be performed by using inverters C01 to C03.

In the following, adjustment of phase shifting due to variations in the operating/environmental condition of the apparatus will be described. As shown in FIG. 1, in this embodiment, programmed input data with respect to the counter circuits B (K06a and K06b) and the delay circuits A (K07a and K07b) in the edge clock generators K02a and K02b are corrected on the basis of the rate in variation of the delay time in delay circuits B (J04a and J04b) for adjustment of phase shifting between various kinds of signals. That is, in the case where the edge clock signal J16a from the edge clock generator K02a is delayed by the phase shifting adjustment delay circuit B (J04a), the real delay time or in other words the real propagation delay is measured through the propagation delay measurement circuit 105. The propagation delay measurement circuit 105 monitors and detects the time difference between a point of time of inputting of the edge clock signal K13 to the delay circuit B (J04a) and a point of time of outputting of the edge clock signal J16a from the delay circuit B (J04a) to thereby measure the real delay time of the delay circuit B (J04a). As described above, the setting of the delay time to the delay circuit B (J04a) has been already performed for adjustment of phase shifting before starting of the test. After starting of the test, the set value of the delay time is not changed.

If the real delay time of the delay circuit B (J04a) is changed in a certain rate because of variations in the operating condition of the automatic test equipment, such as surrounding temperature, supply voltage, etc., in a period of testing, the phase shifting between various kinds of signals cannot be adjusted because different real delay values are set to the respective delay circuits A (K07a and K07b) of the edge clock generators K02a and K02b so that the absolute change quantities of real delay time of the respective delay circuits A (K07a and K07b) are different from each other. In the case where the set delay values with respect to the edge clock generators K02a and K02b are corrected in a predetermined manner on the basis of the rate in variation of the delay time of the delay circuit J04a, however, the phase shifting between various kinds of signals can be adjusted. In detail, if the real delay time 112 is measured in a period of testing under the condition that the real delay time of the delay circuit B (J04a) at the point of time of completion of adjustment of the phase shifting is measured by the propagation delay measurement circuit 105 and then transferred to the arithmetic operation circuit B 104 so as to be stored therein, the absolute change quantity of the real delay time and the propagation delay variation rate 113 can be calculated by arithmetic operation in the arithmetic operation circuit B 104. The propagation delay variation rate 113 is transferred to the arithmetic operation circuits 106a and 106b provided in the all edge clock generators K02a and K02b respectively. The arithmetic operation circuits 106a and 106b correct the set delay data from the data setting circuits K08a and K08b on the basis of the propagation delay variation rate and then re-establish the corrected values to the counter circuits B (K06a and K06b) and the delay circuits A (K07a and K07b).

Figure 8:
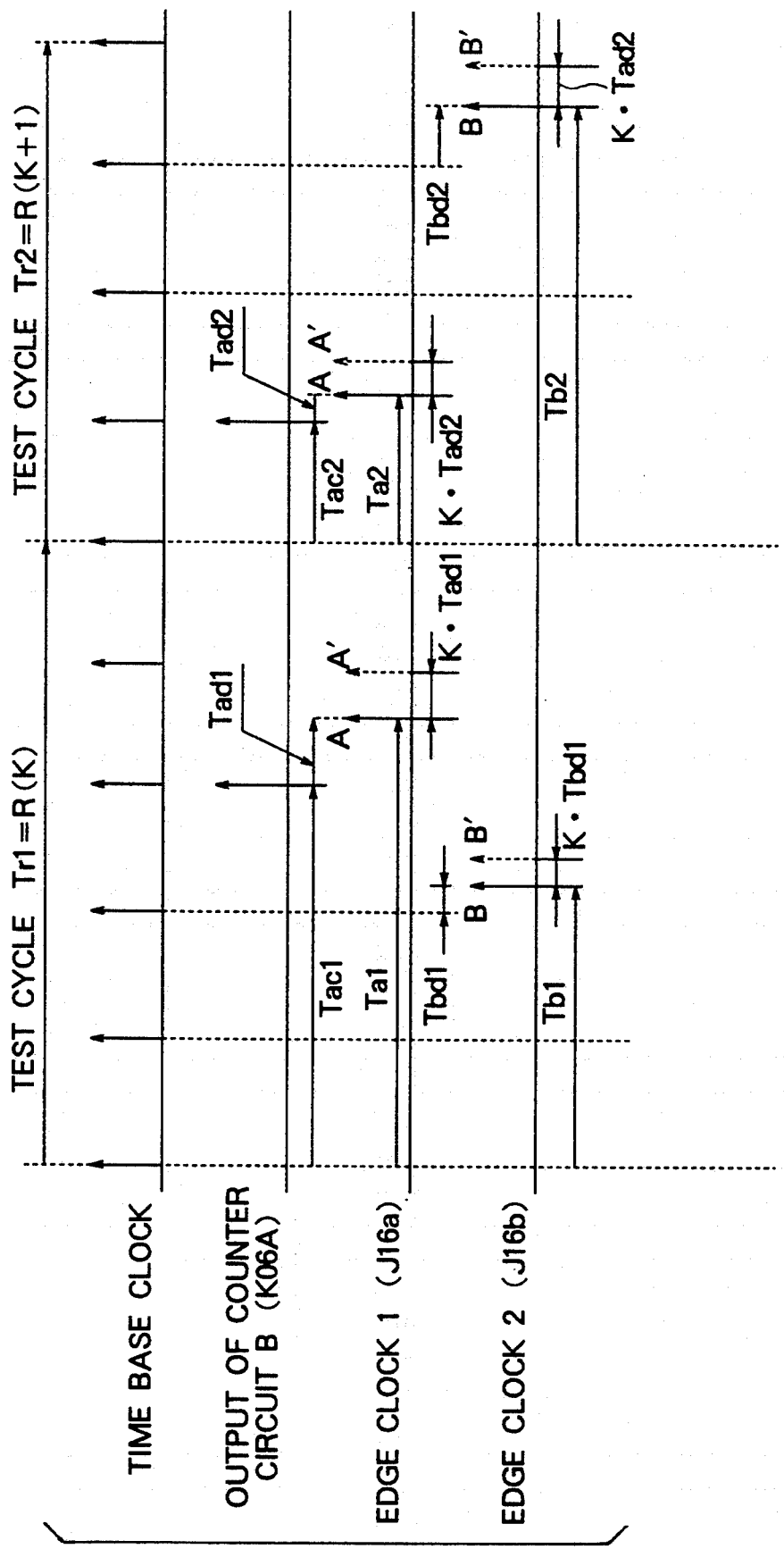
FIG. 8 is a time chart for explaining adjustment of phase shifting.

As described above, the set delay data from the data setting circuits K08a and K08b are corrected on the basis of the propagation delay variation rate 113. Referring to FIG. 8, the state of the correction will be described specifically with respect to the edge clock generators K02a and K02b as an example. Although FIG. 8 shows the phase relationship between respective edge clock signals in a period of testing after adjustment of phase shifting, the set delay values given to the respective delay circuits B (J04) for adjustment of phase shifting are not shown in FIG. 8.

That is, in FIG. 8, the set delay values with respect to the edge clock generators K02a and K02b are expressed by Ta1, Ta2, Tb1 and Tb2 respectively. The set delay values are given by the data setting circuits K08a and K08b so as to vary in accordance with the test cycle. As described above, each of the set delay quantities is expressed by the sum of the set delay time of the counter circuits B (K06 and K06b) and the set delay time to the delay circuits A (K07a and K07b) (in the case of the edge clock signal J16a in the test cycle Tr1, Ta1=Tac1+Tad1). The thus set edge clock signals J16a and J16b which must be originally generated in positions A and B respectively are generated, for example, in positions A' and B' respectively because the signals vary in a constant rate of the delay time set to the delay circuit B (J04a) in accordance with variations in the operating condition and the like. When the variation rate in this case is replaced by K, the variation quantities in the respective edge clock signals J16a and J16b are expressed by K·Tad1 and K·Tbd1 respectively. Even in the case where the variation rate K is constant, phase shifting between various kinds of signals cannot be adjusted because the variation quantities in the respective edge clock signals J16a and J16b are not equal to each other. To make it possible to adjust the phase shifting, in the propagation delay measurement circuit 105 and the arithmetic operation circuit B 104, the variation rate K of the real delay time is calculated as $K=(Tt-Ts)/Ts$ on the basis of the preliminarily measured real delay time Ts of the delay circuit J04a at the time of adjustment of phase shifting and the measured real delay time Tt of the delay circuit J04a at the time of testing and then transferred to the arithmetic operation circuit A (106a) in the edge clock generator K02a. In the arithmetic operation circuit A (106a), the variation quantity KoTad1 in the delay circuit A (K07a) is calculated in accordance with the set delay time Tad1 given from the data setting circuit K08a to the delay circuit A (K07a) on the basis of the variation rate K and then the set delay time Ta1 is changed to the corrected set delay time ($=Ta1-K·Tad1$), so that the edge clock signal J16a is generated in the original position A. Also in the other edge clock generator K02b, correction is performed in the same manner as described above so that the edge clock signal J16b is generated in the original position B. Also in the case where the test cycle is Tr2, the correcting operation is carried out in the same manner as described above so that the same correction is performed in the test cycle.

Figure 9:
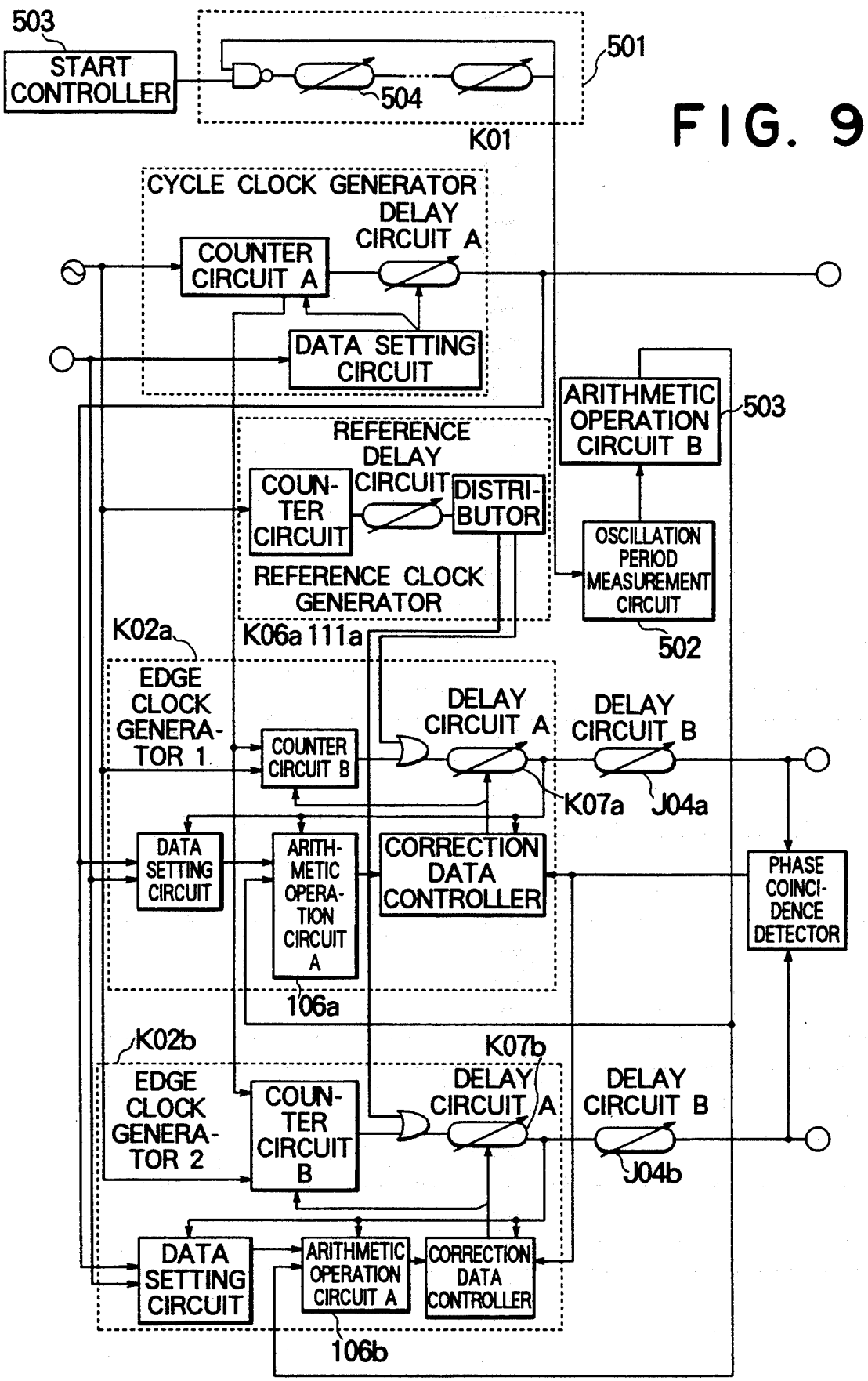
FIG. 9 shows another embodiment of the timing generator in the automatic test equipment according to the present invention.
Figure 10:
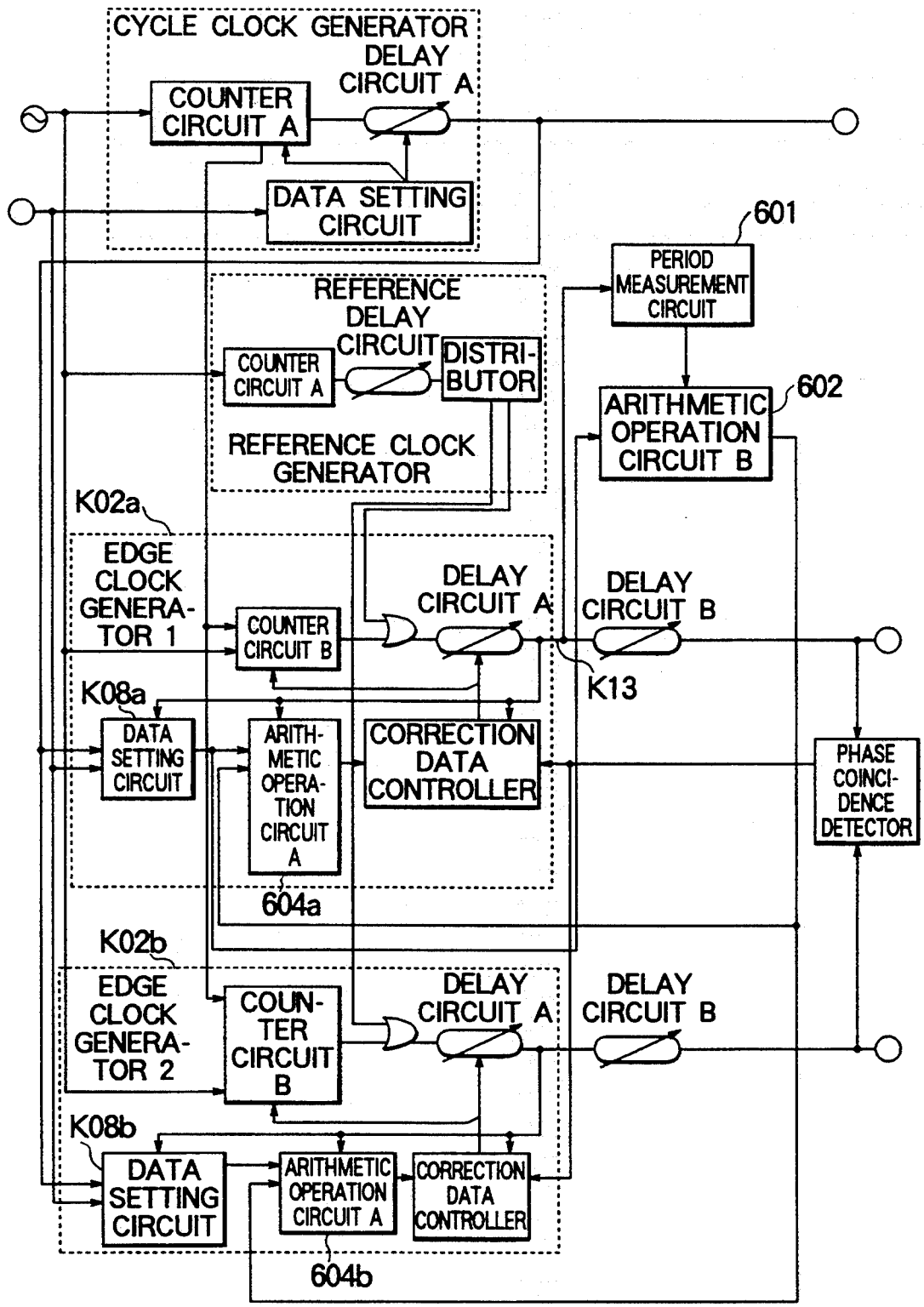
FIG. 10 shows a further embodiment of the timing generator according to the present invention.

FIGS. 9 and 10 show further embodiments which are concerned with correction of phase shifting due to variations in the apparatus operating condition and the like. These embodiments will be described below successively.

Referring to FIG. 9, there is shown a further embodiment which is concerned with correction of phase shifting due to variations in the apparatus operating condition and the like. As shown in FIG. 9, in this embodiment, there are provided an oscillator 501 constituted by using at least one delay circuit 504 having the same delay characteristic as the delay circuits A (K07a and K07b) and B (J04a and J04b), and an oscillation period measurement circuit 502 for measuring the real period of the oscillation output from the oscillator 501. Before execution of testing, for example, just after adjustment of phase shifting, the oscillator 501 is started by a start controller so that the real oscillation period Ts is measured. Then, the real oscillation period Tt is measured at the time of execution of testing so that the variation rate K in the delay circuits (K07a and K07b) is calculated as $K=(Tt-Ts)/Ts$ by an arithmetic operation circuit B 503 on the basis of the real oscillation periods Ts and Tt. The variation rate K thus calculated is transferred to the arithmetic operation circuits A (106a and 106b) in the edge clock generators K02a and K02b so as to be used in correction in the same manner as in the previously described case.

In this embodiment, the oscillator and the oscillation period measurement circuit are provided separately from circuit portions such as edge clock generators, etc. necessary for testing. Accordingly, variations in the apparatus operating condition and the like can be monitored continuously regardless of execution of testing so that correction can be performed from the start of the testing.

Referring to FIG. 10, there is shown a further embodiment which is concerned with correction of phase shifting due to variations in the apparatus operating condition and the like. As shown in FIG. 10, in this embodiment, there are provided a period measurement circuit 601 for measuring a period (edge clock K13 period) Tm of from the point of time of generation of the edge clock pulse K13 from the edge clock generator K02a in the test cycle Tr1 to the point of time of generation of the edge clock pulse K13 in the test cycle Tr2, and an arithmetic operation circuit B (602) for calculating the variation rate of the delay time in the edge clock generator K02a on the basis of the set delay data Ta1, Ta2, Tad1 and Tad2 given to the edge clock generator K02a in the respective test cycles Tr1 and Tr2. The detailed description thereof will be omitted but the variation rate K is calculated as $K=(Tm-Tr1+Ta1-Ta2)/(Tad2-Tad1)$ by the arithmetic operation circuit B (602). The variation rate K thus calculated is transferred to respective arithmetic operation circuits A (604a and 604b) in the edge clock generators K02a and K02b so as to be used in correction in the same manner as in the previously described case. Although this embodiment has shown the case where the period Tm between edge clock pulses is measured as a period between adjacent test cycles, the present invention can be applied to the case where the period Tm is measured as a period between two test cycles between which at least one test cycle is interposed.

Figure 11:
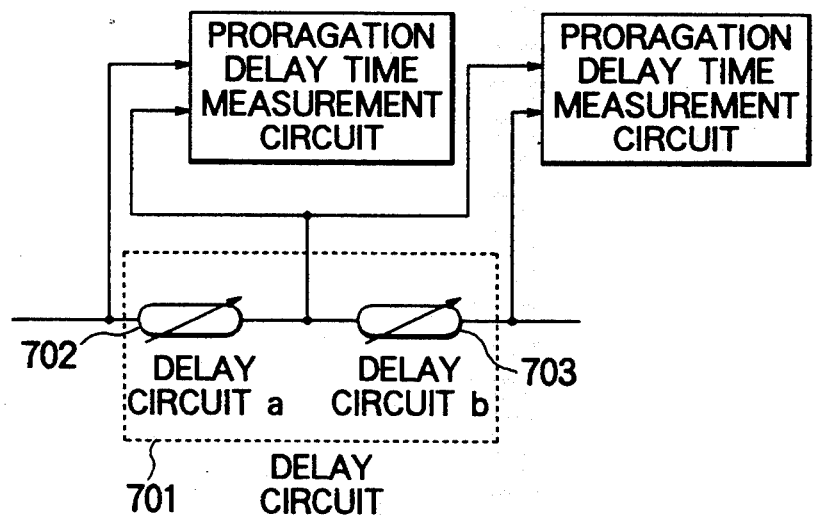
FIG. 11 is a diagram for explaining the case where the delay circuit to be subjected to propagation delay measurement is constituted by a plurality of delay circuits different in characteristic of variations in the propagation delay.

Correction of phase shifting due to variations in the apparatus operating condition and the like has been described above. In the case where the delay circuit A to be subjected to correction and the delay circuit (delay circuit B (J04a) in FIG. 1 or delay circuit 504 in FIG. 9) to be subjected to measurement of the variation rate by the propagation delay measurement circuit 105 and the oscillation period measurement circuit 502 have the same structure as that of a delay circuit 701 constituted by a plurality of delay circuits 702 and 703 different in variation characteristic as shown in FIG. 11, propagation delay measurement circuits 704 and 705 corresponding to the respective delay circuits 702 and 703 or oscillation period measurement circuits corresponding to oscillators can be provided so that variations can be measured individually and corrected. That is, the spirit of the present invention does not change in accordance with the structure of the delay circuit. Although the above description has been made upon the case where one propagation delay measurement circuit 105, one oscillation period measurement circuit 502 or one period measurement circuit 601 is provided, it is a matter of course that the same correction can be performed in the case where a plurality of propagation delay measurement circuits 105, a plurality of oscillation period measurement circuits 502 or a plurality of period measurement circuits 601 are provided if a plurality of arithmetic operation circuits for calculating the variation rate are provided correspondingly to the number of the circuits.

Figure 12:
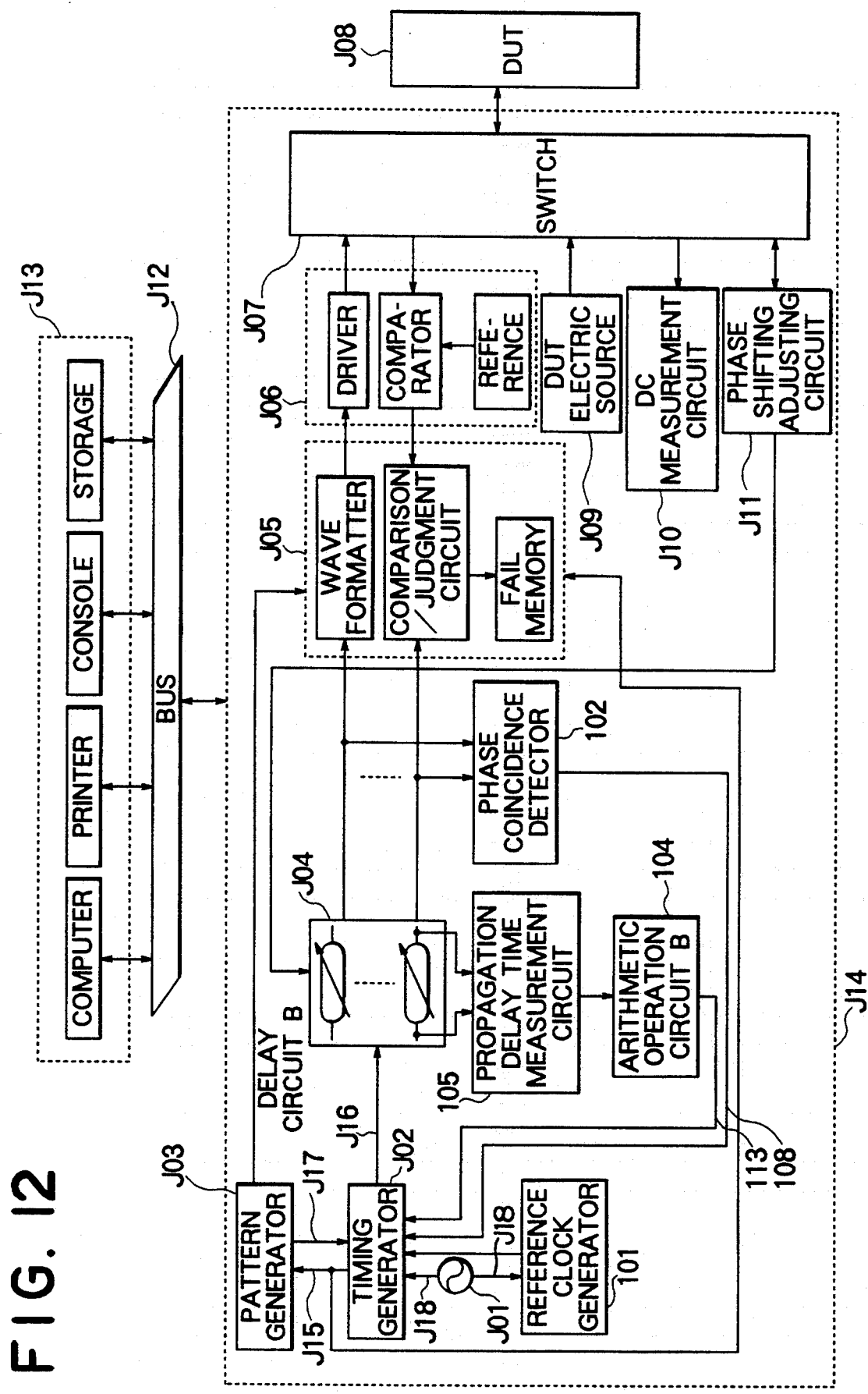
FIG. 12 shows an example of the configuration of the automatic test equipment according to the present invention.

Referring to FIG. 12, there is shown an example of the configuration of the automatic test equipment in the case where various kinds of circuit portions are adapted to correction of resolution and correction of phase shifting due to variations in the apparatus operating condition and the like as described above with reference to FIG. 1.

Figure 13:
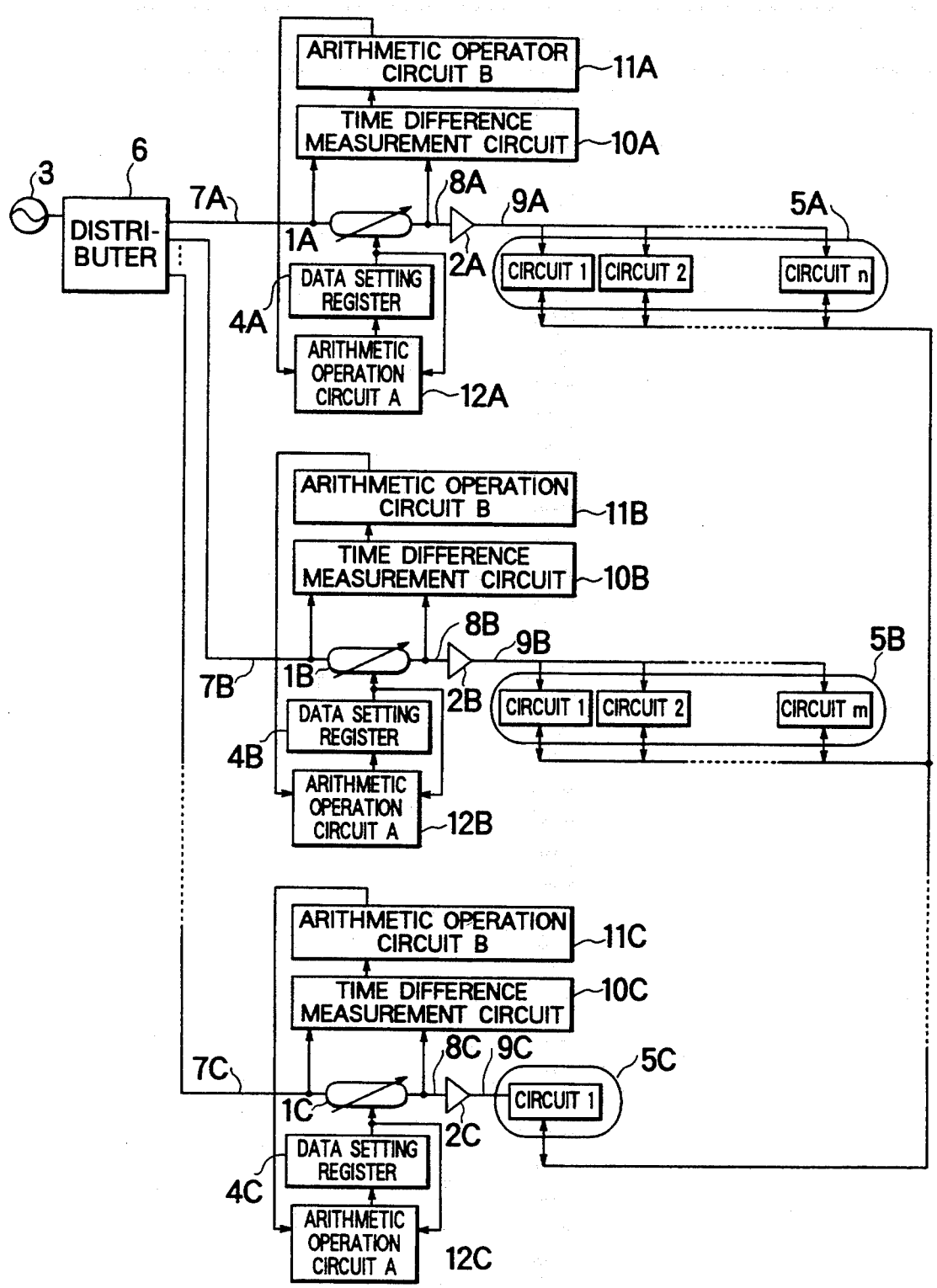
FIG. 13 shows an embodiment of a digital circuitry apparatus provided with a distribution clock correction circuit according to the present invention.
Figure 14:
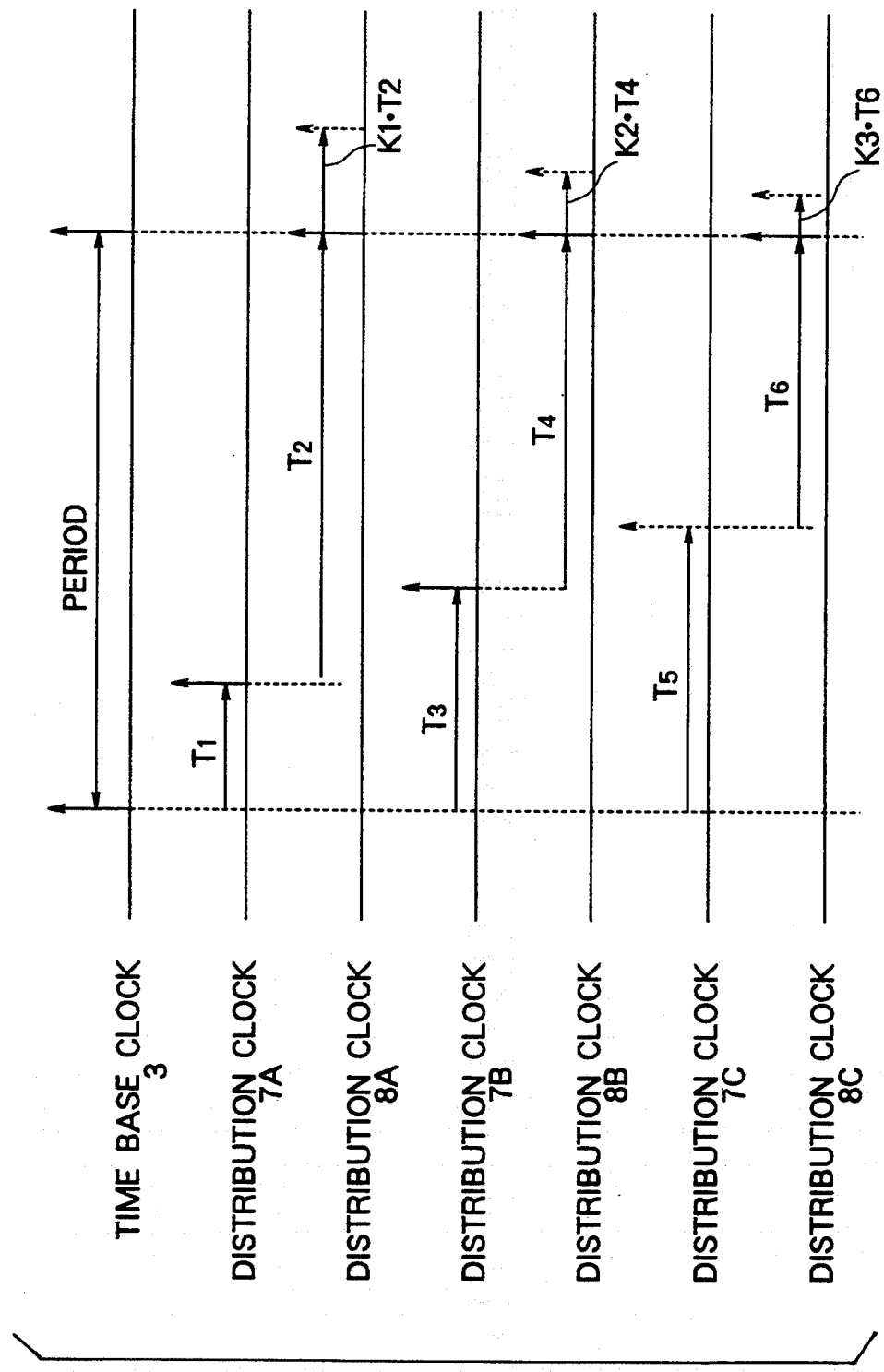
FIG. 14 is a time chart showing the operation of the distribution clock correction circuit depicted in FIG. 13.

In the following, adjustment of phase shifting of distribution clock pulses due to variations in the operating condition of a digital circuitry apparatus such as a micro-processor will be described. Referring to FIG. 13, there is shown a further embodiment according to the present invention. FIG. 14 is an operation time chart. As described above, clock pulses 7A to 7C generated by distribution of the time base 3 are supplied to distribution elements 2A to 2C respectively after the pulses are delayed by T2, T4 and T6 through delay circuits 2A to 2C respectively so that phase shifting produced by distribution is eliminated to make the phases of the pulses equal to the phase of the clock pulse of the time base 3. Assuming now that delay time values of the delay circuits 2A to 2C vary respectively in accordance with variations in the operating condition such as surrounding temperature, supply voltage, etc. of the circuitry apparatus, distribution clock pulses 8A to 8C are generated in points shifted by K1·T2, K2·T4 and K3·T6 as shown in FIG. 14 (in which K1, K2 and K3 are variation rates respectively). Time difference measurement circuits 10A to 10C, time differences (phase differences) between input clock pulses 7A to 7C and output clock pulses 8A to 8C are measured by time difference measurement circuits 10A to 10C respectively. In arithmetic operation circuits B 11A to 11C, the variation rates K1, K2 and K3 are calculated by arithmetic operations using the thus measured time differences and preliminarily measured reference time differences (for example, time differences measured at the time of adjustment of phase shifting due to the distribution). The variation rates thus calculated are transferred to arithmetic operation circuits 12A to 12C provided correspondingly to the delay circuits in the same manner as in the case of the automatic test equipment, so that set data given to the delay circuits are corrected and re-established to make the phases of the distribution clock pulses 8A to 8C equal to the phase of the clock pulse of the time base 3.

Figure 15:
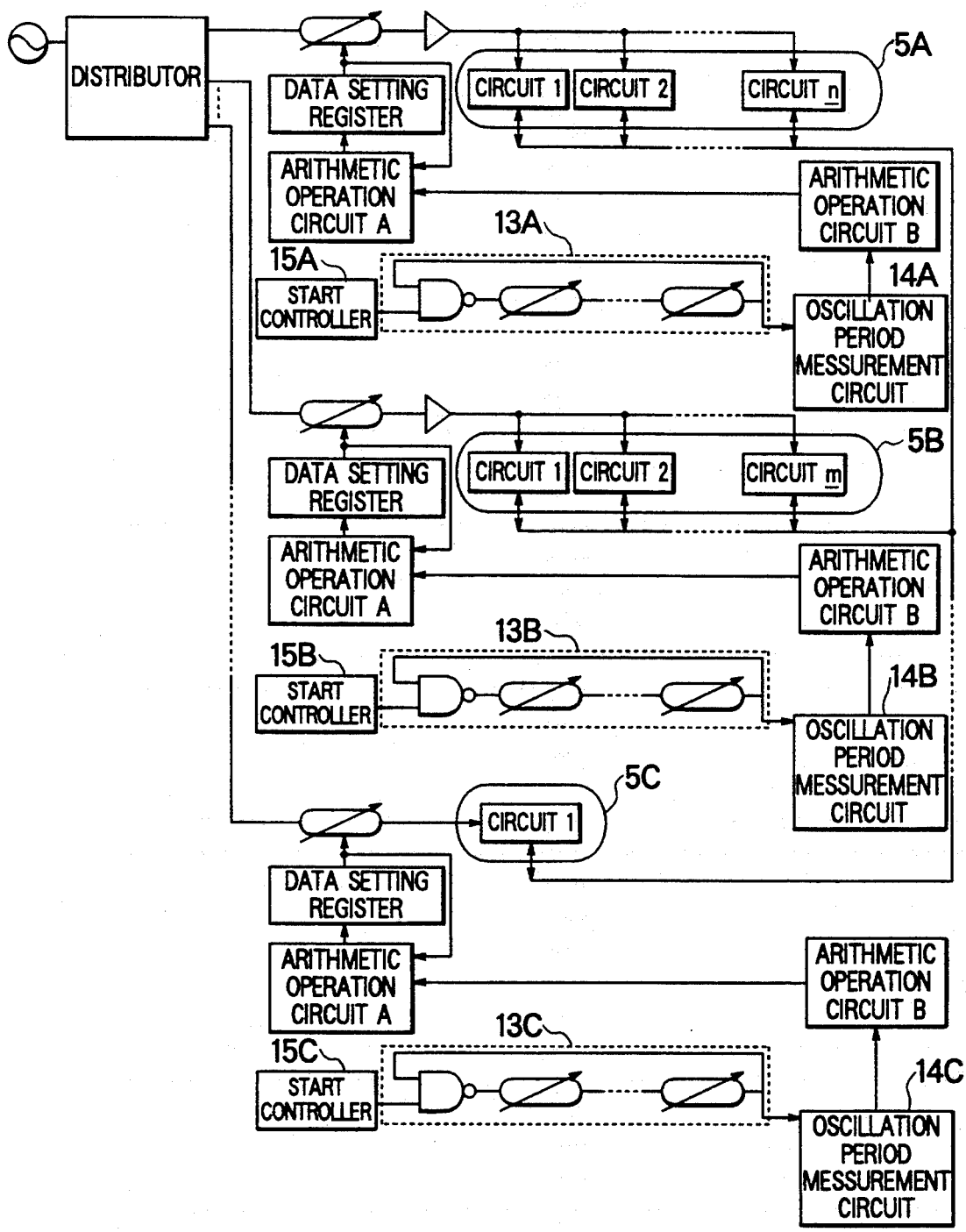
FIG. 15 shows another embodiment of the digital circuitry apparatus provided with the distribution clock correction circuit according to the present invention.
Figure 16:
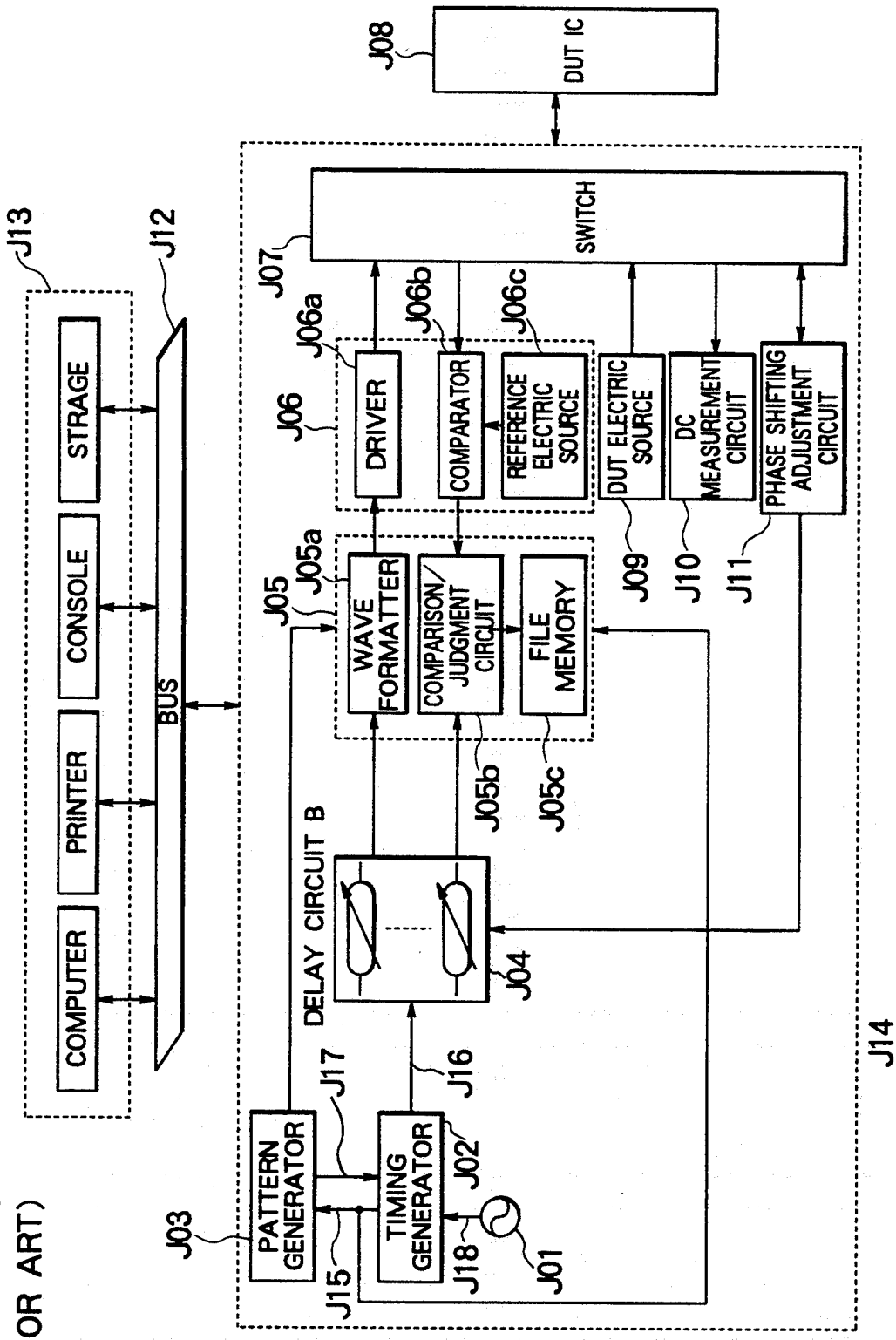
FIG. 16 is a block diagram showing an example of a conventional automatic test equipment.
Figure 17:
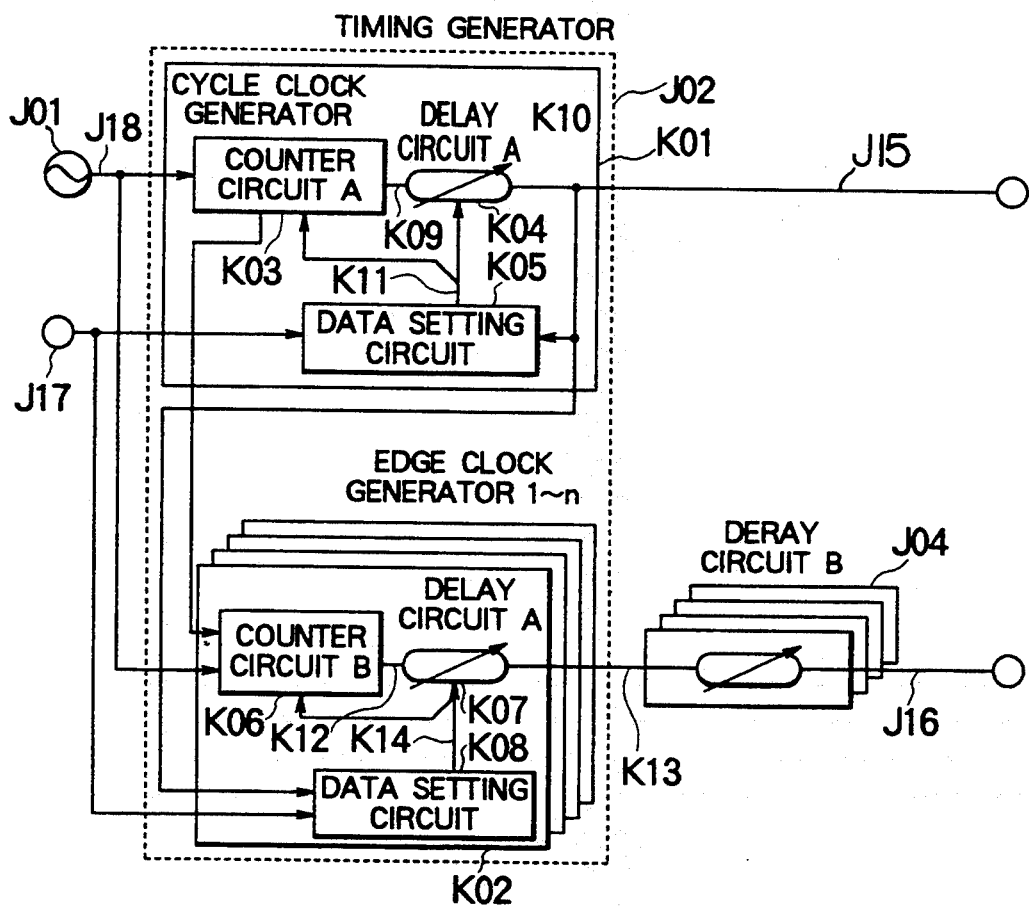
FIG. 17 is a block diagram showing an example of the configuration of the timing generator in the conventional automatic test equipment.
Figure 18:
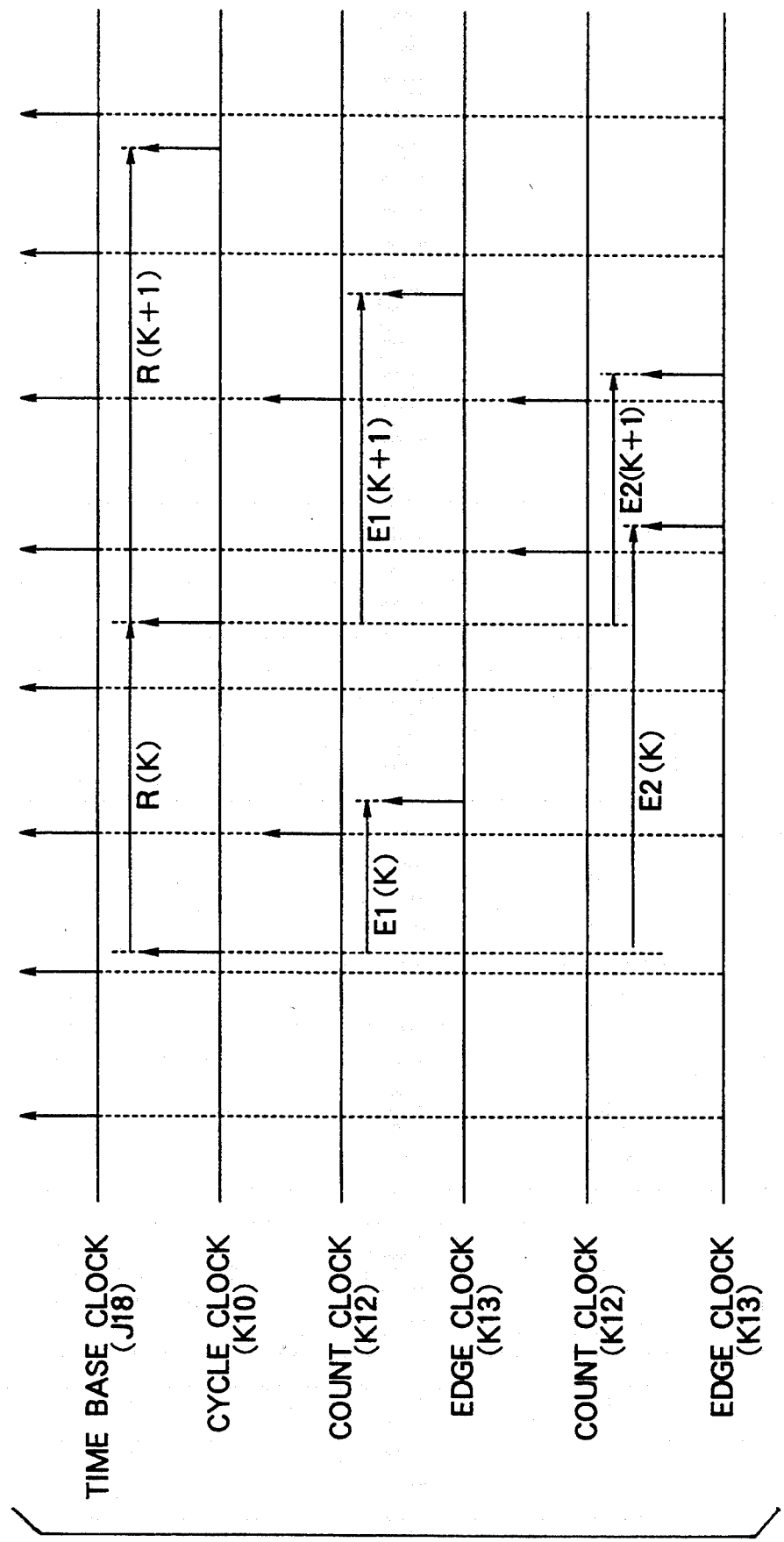
FIG. 18 is a time chart showing the operation of the timing generator depicted in FIG. 17.
Figure 19:
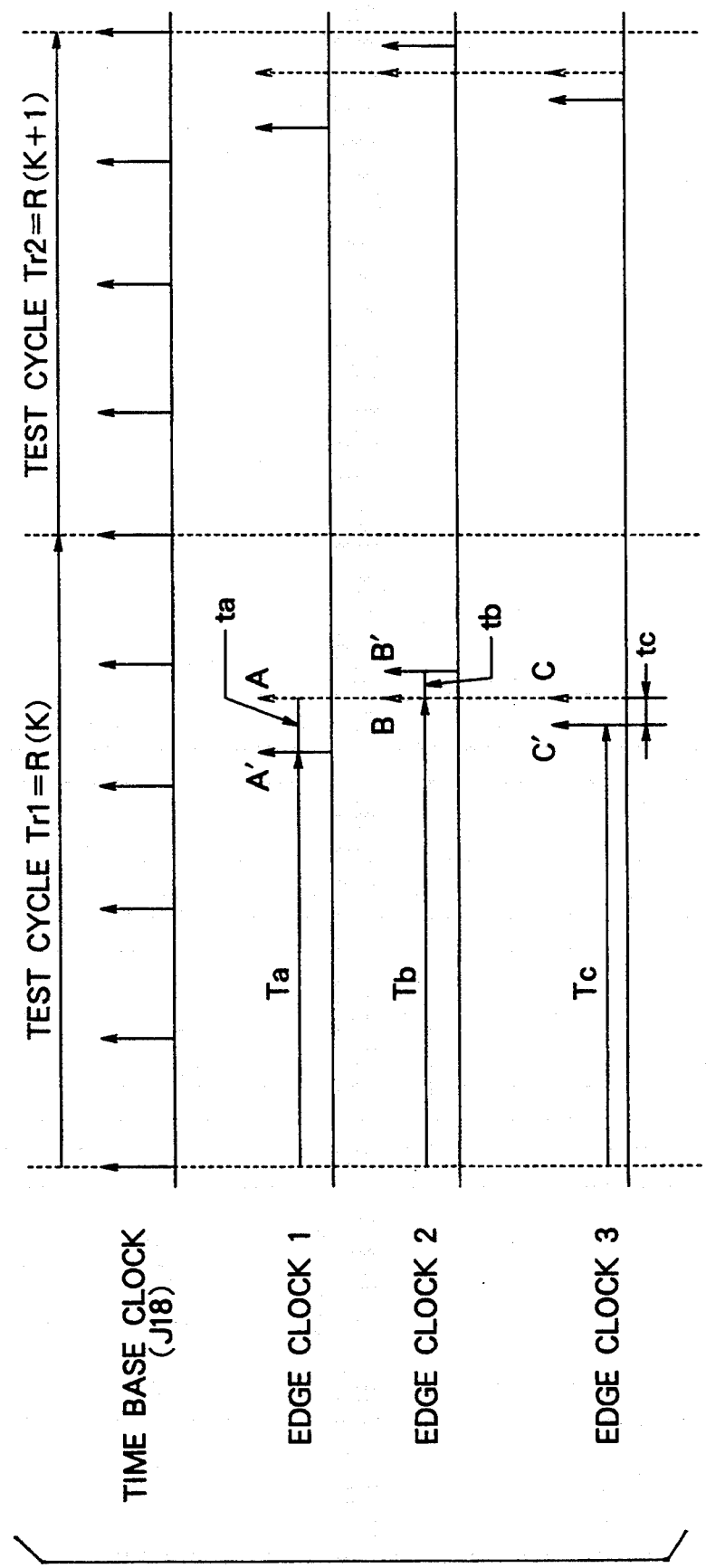
FIG. 19 is a time chart for explaining adjustment of phase shifting in the conventional automatic test equipment.
Figure 20:
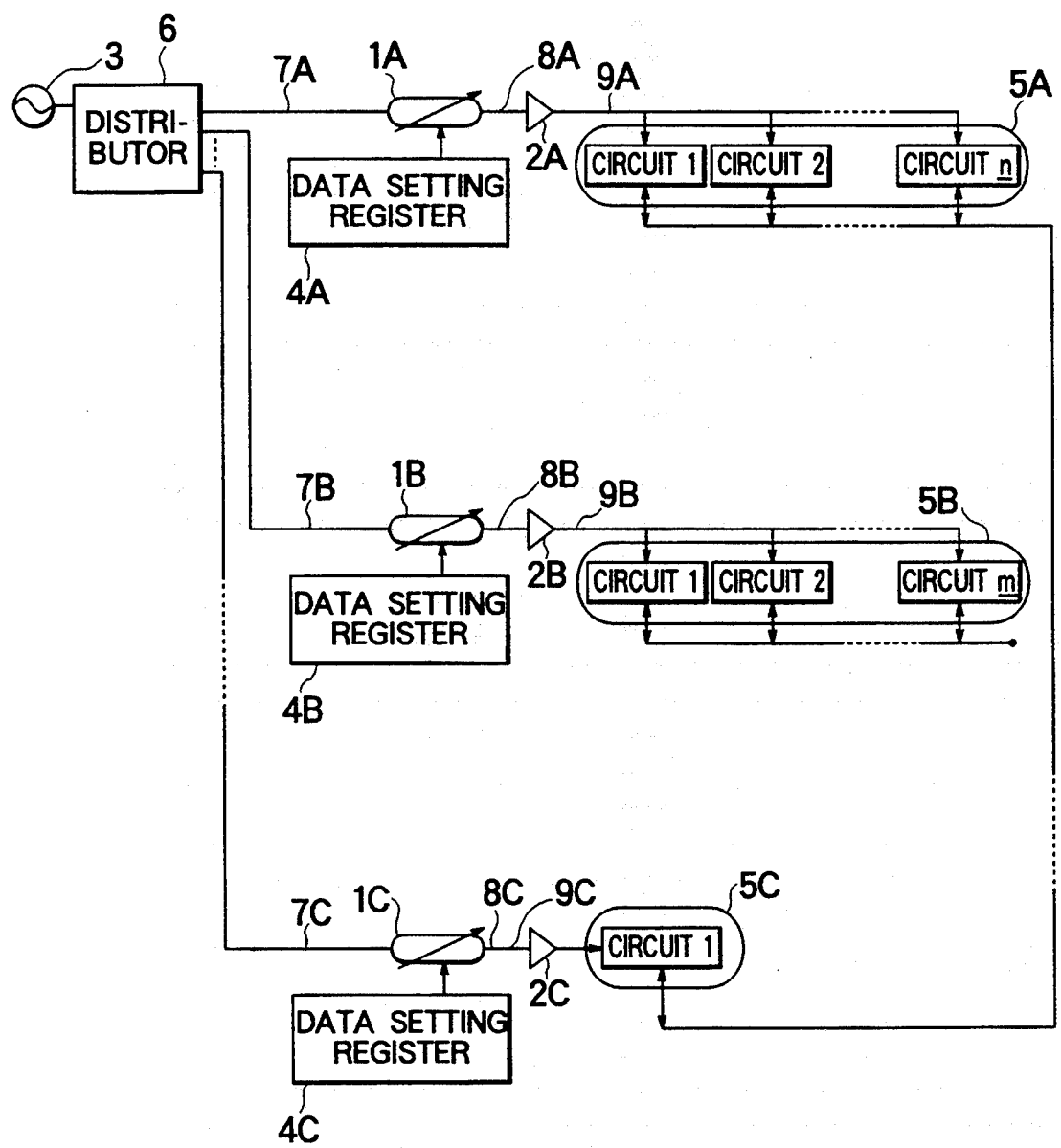
FIG. 20 shows an example of a clock distributor in a conventional digital circuitry apparatus.

FIG. 15 shows a further embodiment in which oscillators 13A to 13C using delay circuits of the same delay characteristic as the phase shifting adjustment delay circuits 2A to 2C and oscillation period measurement circuits 14A to 14C are provided in the same manner as in the case of the automatic test equipment. For example, in a circuit group 5A, the variation rate K1 is calculated by the arithmetic operation circuit B 11A on the basis of the oscillation period T1s measured at the time of adjustment of phase shifting due to distribution and the oscillation period T2t measured at the time of operation of the apparatus. Further, in the arithmetic operation circuit A, the variation delay quantity K1·T2 in the circuit group 5A is calculated on the basis of the variation rate K1 and the set data of the delay circuit 2A, so that the corrected data T2−K1·T2 is set in the delay circuit 2A again. In other circuit groups, the variation rates K2 and K3 are calculated in the same manner as described above, and then correction is performed on the basis of the variation rates so that clock pulses equal in phase to the clock pulse supplied from the time base 3 are supplied.

In this embodiment, distribution clock pulses equal in phase to the clock pulse of the time base can be supplied even in the case where phase shifting occurs in the distribution clock pulses because the delay characteristics of the delay circuits provided for correction of phase shifting due to the distribution of the time base clock signal vary respectively in accordance with variations in the operating condition of the digital circuitry apparatus such as a micro-processor.

Although correction of phase shifting due to variations in the operating condition of the digital circuitry apparatus and the like has been described above, it is to be understood that the spirit of the present invention does not change in accordance with the configuration of delay circuits to be subjected to correction and delay circuits to be subjected to time measurement, the number thereof, etc.

In the digital circuitry apparatus according to the present invention, even in the case where a wide variation occurs in the operating condition of the apparatus per se or in the peripheral environment, highly accurate testing in use of the digital circuitry apparatus as an automatic test equipment or distribution of a time base clock signal into clock signals equal in phase to the time base clock signal in use of the digital circuitry apparatus as a micro-processor can be performed without stopping of the operation and procedure original to the apparatus.

What is claimed is:

1. An automatic test equipment comprising means for generating a first clock signal with a desired cycle by individually variably delaying a common system clock signal of a constant period generated by a system clock oscillator by using a counter circuit and a first delay vernier in order to generate a clock signal for a test stimulus supplied to a device under test (DUT) and a clock signal for fetching a response signal from said DUT to make a comparative judgment as to whether said DUT is good or not, means for generating a plurality of second clock signals having desired programmed delay quantities or cycles so as to be used as said clock signal for said test stimulus and said clock signal for said comparative judgment, and second delay verniers for adjusting the phase or timing between said clock signal for said test stimulus and said clock signal for said comparative judgment, said automatic test equipment further comprising:

a propagation delay measurement circuit for measuring the real propagation delay of any one of said second delay verniers on the basis of input and output signals of said second delay vernier;

a first arithmetic operation circuit for calculating the ratio in variation of the real propagation delay measured by said propagation delay measurement circuit to the real propagation delay at a certain point of time; and a second arithmetic operation circuit provided so as to correspond to said first delay vernier and for re-establishing programmed input data after correcting said programmed input data on said first delay vernier to suppress variations in the propagation delay on the basis of said ratio in variation of the propagation delay calculated by said first arithmetic operation circuit.

2. An automatic test equipment comprising means for generating a first clock signal with a desired cycle by individually variably delaying a common system clock signal of a constant period generated by a system clock oscillator by using a counter circuit and a first delay vernier in order to generate a clock signal for a test stimulus supplied to a device under test (DUT) and a clock signal for fetching a response signal from said DUT to make a comparative judgment as to whether said DUT is good or not, means for generating a plurality of second clock signals having desired progranted delay quantities or cycles so as to be used as said clock signal for said test stimulus and said clock signal for said comparative judgment, and second delay verniers for adjusting the phase or timing between said clock signal for said test stimulus and said clock signal for said comparative judgment, said automatic test equipment further comprising:

a period measurement circuit for measuring a period of from a point of time of appearance of a second clock signal from said first delay vernier in a certain test cycle limited by said first clock signal to a point of time of appearance of said second clock signal from said first delay vernier in a test cycle shifted by a predetermined number of test cycles from said certain test cycle;

a first arithmetic operation circuit for calculating the rate of variation in propagation delay in said first delay vernier on the basis of the read clock period obtained by said period measurement circuit and programmed input data set to said first delay vernier in said test cycle shifted by a predetermined number of test cycles from said certain test cycle; and a second arithmetic operation circuit provided so as to correspond to said first delay vernier and for re-establishing programmed input data after correcting said programmed input data on said first delay vernier to suppress variations in the propagation delay on the basis of the rate in variation of the propagation delay calculated by said first arithmetic operation circuit.

3. A digital circuitry apparatus comprising a system clock oscillator for supplying a constant-period clock signal, a circuit for distributing said clock signal to a plurality of circuit portions, delay verniers provided so as to correspond to said plurality of circuit portions or to paths for distribution of said clock signal and for performing phase adjustment of clock signals supplied to said circuit portions, and a circuit for setting desired programmed input data to said delay verniers, said digital circuitry apparatus further comprising:

a propagation delay measurement circuit for measuring the real delay time of said delay verniers on the basis of input and output signals of said delay verniers;

a first arithmetic operation circuit for calculating the rate in variation of the real delay time measured by said propagation delay measurement circuit to the real delay time at a certain point of time; and a second arithmetic operation circuit provided so as to correspond to said delay verniers and for re-establishing programmed input data after correcting said programmed input data on said first delay vernier to suppress variations in the propagation delay on the basis of the rate in variation of the propagation delay calculated by said first arithmetic operation circuit.

* * * * *

UNITED STATES PATENT AND TRADEMARK OFFICE
CERTIFICATE OF CORRECTION

PATENT NO. : 5,438,259
DATED : August 1, 1995
INVENTOR(S) : Ritsuro Orihashi, et al.

It is certified that error appears in the above-indentified patent and that said Letters Patent is hereby corrected as shown below:

Claim 2, column 16, line 3, delete "progranted" and substitute therefore --programmed--.

Signed and Sealed this

Third Day of October, 1995

Attest:

BRUCE LEHMAN

Attesting Officer

Commissioner of Patents and Trademarks